United States Patent
Pop et al.

(10) Patent No.: US 9,412,442 B2
(45) Date of Patent: Aug. 9, 2016

(54) METHODS FOR FORMING A NANOWIRE AND APPARATUS THEREOF

(75) Inventors: Eric Pop, Champaign, IL (US); Feng Xiong, Urbana, IL (US); Myung-Ho Bae, Daejeon (KR)

(73) Assignee: The Board of Trustees of the University of Illinois, Urbana, IL (US)

( * ) Notice: Subject to any disclaimer, the term of this patent is extended or adjusted under 35 U.S.C. 154(b) by 643 days.

(21) Appl. No.: 13/458,604

(22) Filed: Apr. 27, 2012

(65) Prior Publication Data
US 2013/0285001 A1 Oct. 31, 2013

(51) Int. Cl.
| | | |
|---|---|---|
| *H01L 47/00* | (2006.01) | |
| *H01L 45/00* | (2006.01) | |
| *H01L 27/24* | (2006.01) | |
| *G11C 13/00* | (2006.01) | |
| *G11C 13/02* | (2006.01) | |
| *B82Y 10/00* | (2011.01) | |
| *H01L 29/06* | (2006.01) | |
| *H01L 29/41* | (2006.01) | |
| *H01L 51/00* | (2006.01) | |
| *B82Y 40/00* | (2011.01) | |
| *H01L 51/05* | (2006.01) | |

(52) U.S. Cl.
CPC ............ *G11C 13/0004* (2013.01); *B82Y 10/00* (2013.01); *G11C 13/025* (2013.01); *H01L 29/0673* (2013.01); *H01L 29/413* (2013.01); *H01L 45/04* (2013.01); *H01L 45/1226* (2013.01); *H01L 45/144* (2013.01); *H01L 45/149* (2013.01); *H01L 45/1625* (2013.01); *H01L 51/0048* (2013.01); *B82Y 40/00* (2013.01); *H01L 51/0558* (2013.01)

(58) Field of Classification Search
None
See application file for complete search history.

(56) References Cited

U.S. PATENT DOCUMENTS

| 5,668,766 A | 9/1997 | Bramnik | |
|---|---|---|---|
| 6,574,130 B2 | 6/2003 | Segal | |
| 7,321,130 B2 | 1/2008 | Lung et al. | |
| 7,859,385 B2 | 12/2010 | Bertin et al. | |
| 7,948,054 B2* | 5/2011 | Bertin et al. | 257/529 |
| 8,045,359 B2 | 10/2011 | Furuta et al. | |
| 8,094,484 B2 | 1/2012 | Takahashi et al. | |
| 2003/0030519 A1* | 2/2003 | Wyeth | H01P 1/10 335/78 |
| 2007/0012956 A1* | 1/2007 | Gutsche et al. | 257/246 |
| 2007/0120095 A1 | 5/2007 | Gruner | |
| 2007/0158697 A1 | 7/2007 | Choi | |
| 2007/0233761 A1 | 10/2007 | Mouttet | |

(Continued)

OTHER PUBLICATIONS

Xiong et al. Low Power Switching of Phase-Change Materials with Carbon Nanotube Electrodes. Mar. 10, 2011. Science Express. pp. SOM-1-SOM-10. DOI: 10.1126/science.1201938.*

(Continued)

*Primary Examiner* — Hoang-Quan Ho
(74) *Attorney, Agent, or Firm* — Robert Gingher; Guntin & Gust, PLC

(57) ABSTRACT

A system that incorporates teachings of the subject disclosure may include, for example, a method for depositing a first material that substantially covers a nanoheater, applying a signal to the nanoheater to remove a first portion of the first material covering the nanoheater to form a trench aligned with the nanoheater, depositing a second material in the trench, and removing a second portion of the first material and a portion of the second material to form a nanowire comprising a remaining portion of the second material covering the nanoheater along the trench. Additional embodiments are disclosed.

15 Claims, 22 Drawing Sheets

(56) References Cited

U.S. PATENT DOCUMENTS

| | | | | |
|---|---|---|---|---|
| 2007/0235714 | A1* | 10/2007 | Kwon et al. | 257/9 |
| 2008/0224358 | A1 | 9/2008 | Rogers | |
| 2008/0247226 | A1* | 10/2008 | Liu et al. | 365/163 |
| 2008/0260941 | A1 | 10/2008 | Jin | |
| 2009/0107834 | A1 | 4/2009 | Ye | |
| 2009/0108247 | A1* | 4/2009 | Takaura et al. | 257/2 |
| 2009/0108307 | A1* | 4/2009 | Yang | H01L 21/823807 257/288 |
| 2009/0161407 | A1 | 6/2009 | Masuda et al. | |
| 2009/0278111 | A1* | 11/2009 | Pop | B82Y 10/00 257/4 |
| 2010/0072450 | A1* | 3/2010 | Son | 257/4 |
| 2010/0322008 | A1* | 12/2010 | Yoneya et al. | 365/185.18 |
| 2010/0327247 | A1 | 12/2010 | Ward et al. | |
| 2011/0182115 | A1* | 7/2011 | Yoon | C30B 25/005 365/163 |
| 2012/0156833 | A1* | 6/2012 | Kawashima et al. | 438/151 |
| 2012/0324724 | A1* | 12/2012 | Liu et al. | 29/832 |
| 2013/0228751 | A1* | 9/2013 | Gotsmann et al. | 257/24 |
| 2013/0240842 | A1* | 9/2013 | Rinzler et al. | 257/40 |
| 2013/0279245 | A1* | 10/2013 | Pop et al. | 365/163 |

OTHER PUBLICATIONS

"Local characterization and transformation of phase-change media by scanning thermal probes", J. Appl. Phys. 95, 2360 (2004).
Boniardi, "Physical origin of the resistance drift exponent in amorphous phase change materials", Appl. Phys. Lett. 98, 243506 (2011).
Borghetti, "'Memristive' switches enable 'stateful' logic operations via material implication", Nature, vol. 464/8, Apr. 2010.
Bruns, et al., "Nanosecond switching in GeTe phase change memory cells", Appl. Phys. Lett. 95, 043108 (2009).
Burr, et al., "Phase change memory technology", J. Vac. Sci. Technol. B 28(2), Mar./Apr. 2010.
Chen, et al., "Compact Thermal Model for Vertical Nanowire Phase-Change Memory Cells", IEEE Transactions on Electron Devices, vol. 56, No. 7, Jul. 2009.
Chen, , "Highly Scalable Hafnium Oxide Memory with Improvements of Resistive Distribution and Read Disturb Immunity", IEEE, 97-4244-5640-06/09, 2009.
Chua, , "Low resistance, high dynamic range reconfigurable phase change switch for radio frequency applications", Appl. Phys. Lett. 97, 183506 (2010).
Guo, , "Covalently Bridging Gaps in Single-Walled Carbon Nanotubes with Conducting Molecules", Science 311, 356 (2006).
Ielmini, et al., "Analytical model for subthreshold conduction and threshold switching in chalcogenide-based memory devices", J. Appl. Phys. 102, 054517 (2007).
Ielmini, , "Reliability Impact of Chalcogenide-Structure Relaxation in Phase-Change Memory (PCM) Cells—Part I: Experimental Study", IEE Transactions on Electron Devices, vol. 56, No. 5, May 2009.
Ielmini, , "Threshold switching mechanism by high-field energy gain in the hopping transport of chalcogenide glasses", Physcial Review B 78, 035308 (2008).
Jin, , "Localized Termperature and Chemical Reaction Control in Nanoscale Space by Nanowire Array", Nano Lett. 2011, 11, 4818-4825.
Kang, , "PRAM cell technology and characterization in 20nm node size", IEEE, 2011, 978-1-4577-0505-2/11.
Khajetoorians, , "Realizing All-Spin-Based Logic Operations Atom by Atom", Science 332, 1062 (2011).
Lee, et al., "Highly scalable non-volatile and ultra-lowpower phase-change nanowire memory", Nature Nanotechnology, vol. 2, Oct. 2007.
Li, , "Explore Physical Origins of Resistance Drift in Phase Change Memory and its Implicatios for Drift-insensitive Materials", IEEE, 2011, 978-1-4577-0505-2/11.
Liang, , "A 1.4uA Reset Current Phase Change Memory Cell with Integrated Carbon Nanotube Electrodes for Cross-Point Memory Application", 2011 Symposium on VLSI Technology Digest of Technical Papers.

Liao, , "Avalanche-Induced Current Enhancement in Semiconducting Carbon Nanotubes", PRL 101, 256804 (2008).
Liao, et al., "Thermal dissipation and variability in electrical breakdown of carbon nanotube devices", Physical Review B 82, 205406 (2010).
Lin, , "Self-Aligned Nanolithography in a Nanogap", Nano Letters, 2009, vol. 9, No. 6, 2234-2238.
McCamey, "Electronic Spin Storage in an Electrically Readable Nuclear Spin Memory with a Lifetime > 100 Seconds", Science 330, 1652 (2010).
Meister, et al., "Void Formation Induced Electrical Switching in Phase-Change Nanowires", Nano Letters, 2008, vol. 8, No. 12, 4562-4567.
Mitra, , "Extremely low drift of resistance and threshold voltage in amorphous phase change nanowire devices", Appl. Phys. Lett. 96, 222111 (2010).
Pirovano, "Scaling Analysis of Phase-Change Memory Technology", IEEE 2003, 0-7803-7872-5/03.
Pop, et al., "Electrical and thermal transport in metallic single-wall carbon nanotubes on insulating substrates", J. Appl. Phys. 101, 093710 (2007).
Pop, , "Energy Dissipation and Transport in Nanoscale Devices", Nano Res (2010) 3: 147-169.
Pop, , "The role of electrical and thermal contact resistance for Joule breakdown of single-wall carbon nanotubes", Nanotechnology 19 (2008) 295202 (5pp).
Qi, et al., "Miniature Organic Transistors with Carbon Nanotubes as Quasi-One-Dimensional Electrodes", J. Am. Chem. Soc. 2004, 126, 11774-11775.
Raoux, , "Phase-change random access memory: A scalable technology", IBM J. Res. & Dev. vol. 52, No. 4/5, Jul./Sep. 2008.
Russo, , "Modeling of Programming and Read Performance in Phase-Change Memories—Part I: Cell Optimization and Scaling", IEEE Transactions on Electron Devices, vol. 55, No. 2, Feb. 2008.
Servalli, , "A 45nm Generation Phase Change Memory Technology", IEEE, 2009, 97-4244-5640-6/09.
Thiele, , "Controlled fabrication of single-walled carbon nanotube electrodes by electron-beam-induced oxidation", Appl. Phys. Lett. 99, 173105 (2011).
Venkatesan, , "Stacked Graphene-A12O3 Nanopore Sensors for Sensitive Detection of DNA and DNA-Protein Complexes", ACS Nano, vol. 6, No. 1, 441-450, 2012.
Wang, et al., "Fast phase transitions induced by picosecond electrical pulses on phase change memory cells", Appl. Phys. Lett. 93, 043121 (2008).
Waser, , "Nanoionics-based resistive switching memories", Nature Materials, vol. 6, Nov. 2007.
Wong, , "Phase Change Memory", IEEE No. 12, Dec. 2010, Proceedings of the IEEE.
Wuttig, et al., "Phase-change materials for rewriteable data storage", Nature Materials, vol. 6, Nov. 2007.
Xiong, , "Inducing chalcogenide phase change with ultra-narrow carbon nanotube heaters", Appl. Phys. Lett. 95, 243103 (2009).
Xiong, , "Low Power Switching of Phase-Change Materials with Carbon Nanotube Electrodes", Science Express, Mar. 10, 2011.
Yang, , "Memristive swtiching mechanism for metal/oxid/metal nanodevices", Nature Nanotechnology, vol. 3, Jul. 2008.
Yu, et al., "Minimum Voltage for Threshold Switching in Nanoscale Phase-Change Memory", Nano Letters, 2008, vol. 8, No. 10, 3429-3433.
Adee, , "The Mysterious Memristor", pp. 1-5, IEEE Spectrum Online; May 2008; http://www.spectrum.ieee.org/ may08/6207; website last visited May 5, 2008.
Aguirre, et al., "Carbon Nanotubes as Injection Electrodes for Organic Thin Film Transistors", Nano Letters, 2009, vol. 9, No. 4, 1457-1461.
Bonsor, , "How Nanotechnology Works", http://science.howstuffworks.com/nanotechnology2.htm; Nov. 20, 2012.
Chen, et al., "Programmable via Using Indirectly Heated Phase-Change Switch for Reconfigurable Logic Applications", IEEE Electron Device Letters, vol. 29, No. 1, Jan. 2008.

(56) References Cited

OTHER PUBLICATIONS

Chen, et al., "Ultra-Thin Phase-Change Bridge Memory Device Using GeSb", IBM/Qimonda/Macronix PCRAM Joint Project, 2006.

Im, et al., "A Unified 7.5nm Dash-Type Confined Cell for High Performace PRAM Device", Process Development Team, Samsung Electronics Co. Ltd, 2008.

Kalb, et al., "Kinetics of crystal nucleation in undercooled droplets of Sb- and Te-based alloys used for phase change recording", J. Appl. Phys. 98, 054910 (2005).

Karpov, , "Field-induced nucleation in phase change memory", Physical Review B 78, 052201 (2008).

Kolobov, et al., "Understanding the phase-change mechanism of rewritable optical media", Nature Materials, vol. 3, Oct. 2004.

Krebs, et al., "Threshold field of phase change memory materials measured using phase change bridge devices", Appl. Phys. Lett. 95, 082101 (2009).

Lacaita, , "Phase change memories: State-of-the-art, challenges and perspectives", Solid-State Electronics 50 (2006) 24-30.

Lankhorst, et al., "Low-cost and nanoscale non-volatile memory concept for future silicon chips", Nature Materials, vol. 4, Apr. 2005.

Lee, et al., "Highly Scalable Phase Change Memory with CVD GeSbTe for Sub 50nm Generation", 2007 Symposium on VLSI Technology Digest of Technical Papers.

Lyeo, et al., "Thermal conductivity of phase-change material Ge2Sb2Te5", Appl. Phys. Lett. 89, 151904 (2006).

Markoff, "H.P. Unveils New Memory Technology", pp. 1-3, New York Times; May 1,2008; http://www.nytimes.com/2008/05/01/technology; website last visited May 5, 2008.

Raoux, et al., "Phase Change Materials and Their Application to Nonvolatile Memories", Chem. Rev. 2010, 110, 240-267.

Redaelli, et al., "Electronic Switching Effect and Phase-Change Transition in Chalcogenide Materials", IEEE Electron Device Letters, vol. 25, No. 10, Oct. 2004.

Sands, , "Nanotubes and Nanowires", NCLT Jul. 13, 2006.

Strukov, "The Missing Memristor Found", 1 page, Nature International Weekly Journal of Science, 453, 80-83; May 1, 2008; http://www.nature.com/nature/journal/v453/n7191/abs/nature06932.html; website last visited May 5, 2008.

Wong, et al., "Phase Change Memory", Proceedings of the IEEE, vol. 98, No. 12, Dec. 2010.

Yao, et al., "Resistive Switching in Nanogap Systems on SiO2 Substrates", Small 2009, 5, No. 24, 2910-2915.

Yoon, , "Phase-Change-Driven Programmable Switch for Nonvolatile Logic Applications", IEEE Electron Device Letters, vol. 30, No. 4, Apr. 2009.

\* cited by examiner

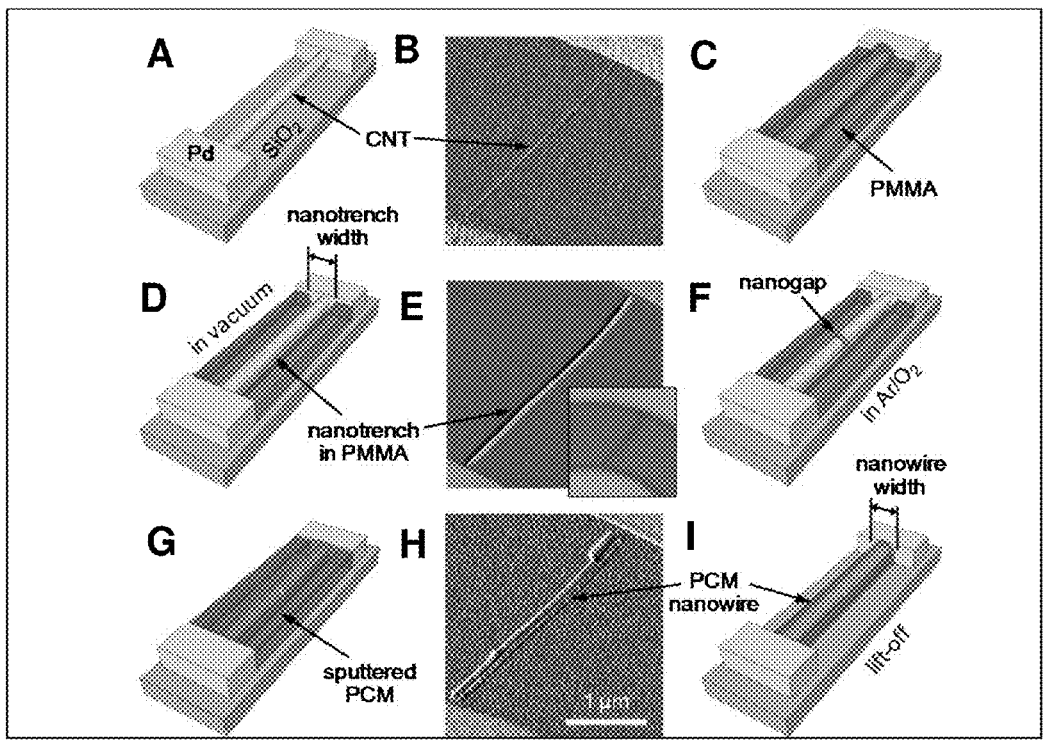
FIGs. 1A-I
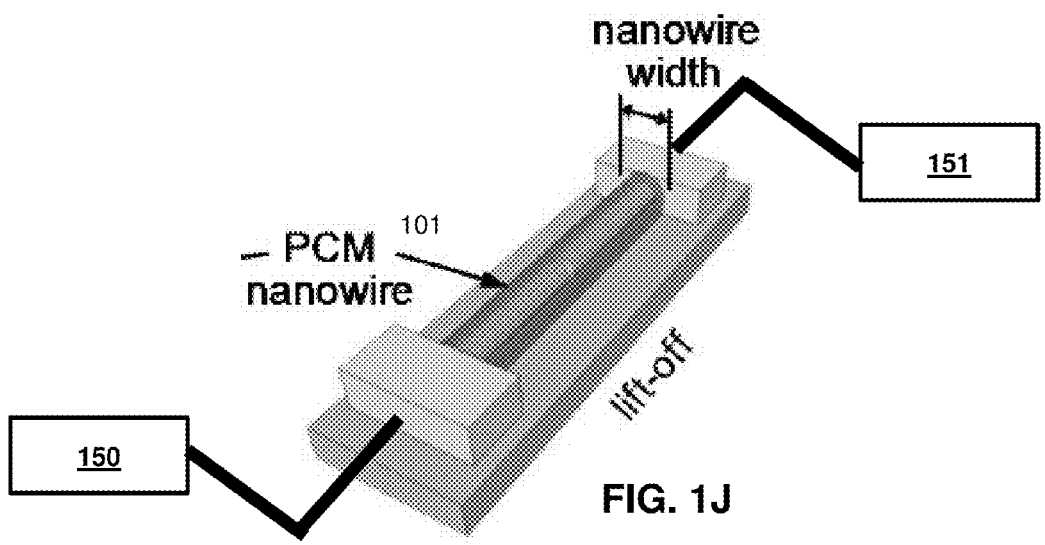
FIG. 1J

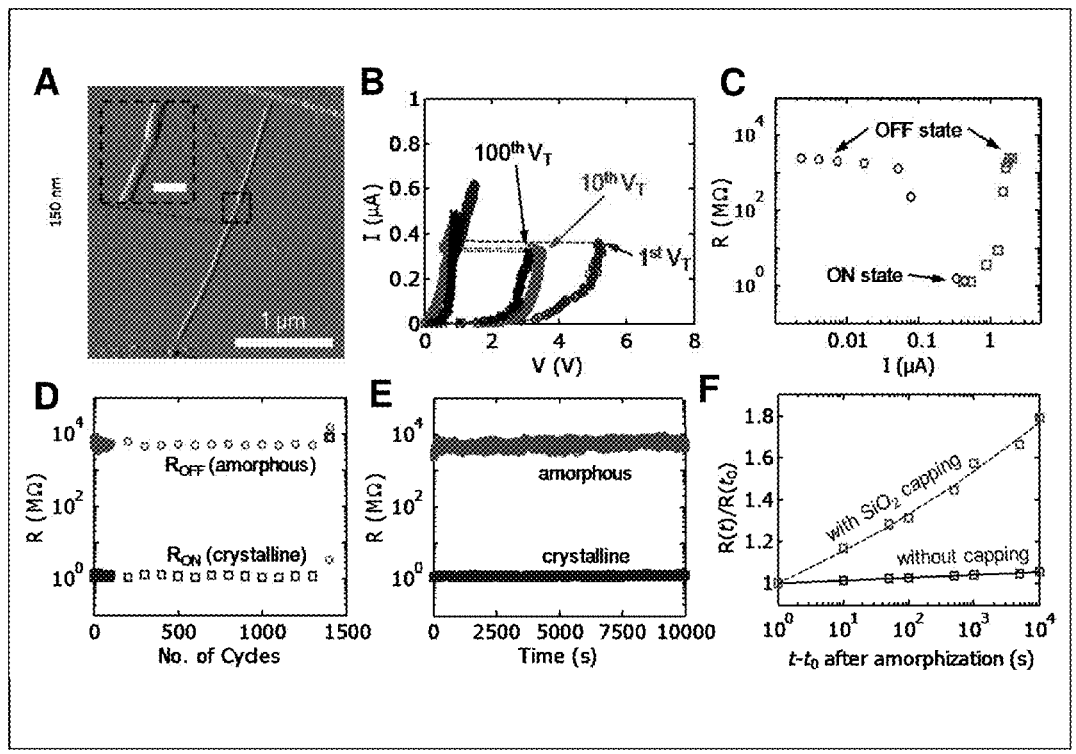
FIGs. 2A-F

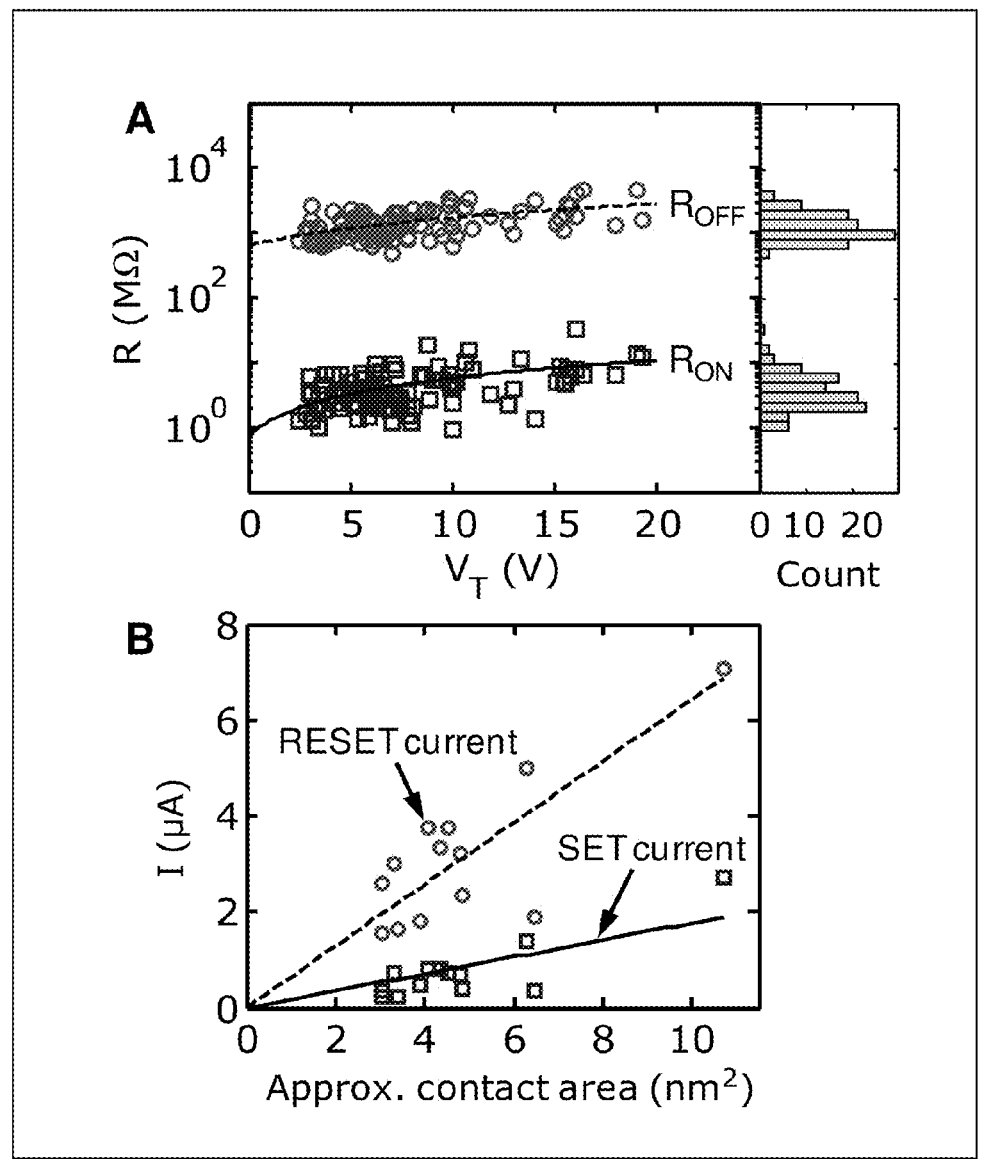
FIGs. 3A-B

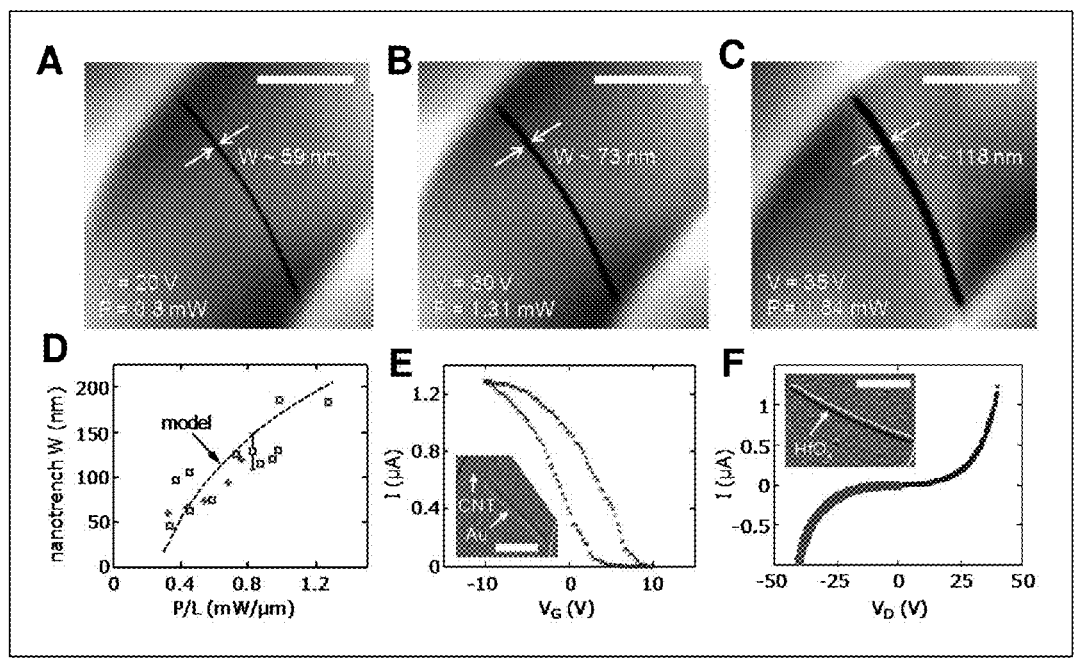
FIGs. 4A-F

| Solution Composition | RPM | Thickness (nm) |
|---|---|---|
| 50% PMMA, 50% A-thinner | 4000 | 27 |
| 75% PMMA, 25% A-thinner | 4000 | 40 |
| 100% PMMA | 6000 | 45 |
| 100% PMMA | 4500 | 52 |
| 100% PMMA | 3500 | 57 |
| 100% PMMA | 2500 | 86 |
| 100% PMMA | 1500 | 113 |

METHODS FOR FORMING A NANOWIRE AND APPARATUS THEREOF

STATEMENT AS TO FEDERALLY SPONSORED RESEARCH

This invention was made with government support under contract number 1-489177-392030-191100 awarded by Office of Navy Research, and with the SRC Focus Center Research Program (FCRP) contract 1-555388-487001-191100. The government has certain rights in the invention.

FIELD OF THE DISCLOSURE

The subject disclosure relates to methods for forming a nanowire and apparatus thereof.

BACKGROUND

Computing and data storage based on spin[1,2], resistive switching[3,4] or phase change[5-13] has received considerable attention as charge-based electronics approach their fundamental scaling limits, particularly due to charge leakage and power dissipation issues[14]. Phase change materials (PCMs) such as the chalcogenide $Ge_2Sb_2Te_5$ (GST), are particularly interesting for applications in electrical/optical data storage[5-13] and reconfigurable electronics[15]. Unlike conventional charge-based electronics, PCM devices store data as the state of the material which can be reversibly switched between a high-resistance amorphous and a conductive crystalline phase. This behavior renders them effectively immune to leakage for low-power electronics, or radiation damage for remote terrestrial or space applications. PCM switching is induced by Joule heating through voltage pulses for electrically-programmable PCMs[6-13]. However, such devices have historically required relatively high programming current (0.1-0.5 mA) and power (~0.5 mW)[6,7]. To address this challenge, the dimensions of the programmable bit could be reduced by confining[16] it into nanowires (NW)[8,9,13], or by contacting it with sharp electrodes like carbon nanotubes (CNTs)[10-12]. NWs confine the bit in the cross-plane perpendicular to the current flow, while CNTs can contact very small bit dimensions commensurate with their ~2-nm diameter.

BRIEF DESCRIPTION OF THE DRAWINGS

Reference will now be made to the accompanying drawings, which are not necessarily drawn to scale, and wherein:

FIG. 1| Schematics and AFM imaging of self-aligned device. A. CNT between two Pd electrodes. B., Atomic force microscopy (AFM) of a CNT with length L ~3.1 μm and diameter d~2.2 nm. C. The CNT device is coated with a thin layer (~50 nm) of polymethyl methacrylate (PMMA). D. Current flow in the CNT leads to Joule heating and nanotrench formation along it as the PMMA evaporates (in vacuum). E. AFM imaging of nanotrench (~90 nm wide) in PMMA. Inset shows nanotrench is visible under the optical microscope, enabling quick detection. F. CNT nanogap is formed by electrical cutting under $Ar/O_2$ flow. G. PCM deposition covers the device and fills the nanogap and nanotrench. H-J, AFM imaging and schematic of self-aligned NW with CNT electrodes obtained after PMMA lift-off. Some devices were further encapsulated with a ~10-nm layer of evaporated $SiO_2$. j. The self-aligned device is illustrated coupled with circuit components.

FIG. 2|Device electrical characteristics. A. AFM image of a self-aligned NW with CNT electrodes of d~2.5 nm. The chalcogenide $Ge_2Sb_2Te_5$ (GST) nanowire is ~40 nm wide, ~10 nm tall, and capped by ~10 nm $SiO_2$. Inset zoom-in shows nanogap region (scale bar 150 nm). B. Electrical characteristics of the $1^{st}$, $10^{th}$ and $100^{th}$ SET switch, showing the threshold voltage stabilizes at $V_T$~3.2 V. C. Resistance switching after a series of current pulses with increasing amplitude. SET (RESET) pulses have 300 ns (100 ns) width and rising (falling) edges of 50 ns (2 ns). The SET (RESET) current is ~0.4 μA (~1.9 μA). The ratio $R_{OFF}/R_{ON}$=2.5 GΩ/1.3 MΩ, nearly ~2000×. D. Endurance test over nearly 1500 cycles of operation. E. On and off states are stable for $10^4$ s under a constant 1 V readout, equivalent to $10^{11}$ read operations with 100-ns pulses. F. Normalized resistance drift in off-state after re-amorphization without (blue squares) and with (red circles) $SiO_2$ capping. The solid and dashed linear fit shows drift coefficient α~0.006 and 0.062, respectively.

FIG. 3|Device statistics. A. On and off-state resistance of 102 self-aligned NW-CNT devices studied, plotted against their threshold voltages $V_T$. The solid and dashed fits suggest approximately linear scaling between R1 and $V_T$, both governed by the bit size within the CNT nanogap (also see FIG. 2a inset). The y-intercept of the on-state represents the remaining parasitic resistance, and the slopes of both lines can be used to estimate the approximate bit cross-sectional area (see text). The average $R_{OFF}/R_{ON}$~900 and some devices have ratio ~2000, near the intrinsic limits achievable with the GST material. The right panel shows a histogram of the same data set. B. SET and RESET programming currents of 13 self-aligned devices suggest approximately linear scaling as a function of CNT electrode tip area (also see Supplement). The solid (dashed) line is a fit of the SET (RESET) current with a slope of 0.17 μA/$nm^2$ (0.64 μA/$nm^2$).

FIG. 4|Tuning nanotrench formation and other applications. A-C. AFM images of nanotrench formed in PMMA after the CNT is biased at different voltage and power for 5 s each, as listed on the panels. A metallic CNT was used with L~2.4 μm and d~2.5 nm. Nanotrenches were formed in vacuum and AFM imaged in air. The PMMA was removed and respun (~50 nm thick) after each step. Narrower trenches do not reach the Pd electrodes (at top-left and bottom-right of each image) due to cooling effect of metal contacts[12]. D. Nanotrench widths scale approximately logarithmically with the input power per CNT length. Red stars are from the same device in FIGS. 4a-c; blue squares are from other devices. The dashed curve is a computational model detailed in the Supplement. Error bar shows typical uncertainty in nanotrench width from the AFM measurement. Additional uncertainty (vs. the model) is introduced by possible PMMA reflow during heating. E-F. Electrical measurements and AFM images of two self-aligned NWs (~60 nm wide) with CNT electrodes enabled by this process. E. Au NW aligned in series with semiconducting CNT, showing that gating of CNT (with bottom Si substrate, $V_G$) still controls current flow. F. $HfO_x$ NW aligned on metallic CNT nanogap. All scale bars are 1 μm.

SUPPLEMENTAL FIGURES

FIG. 5|PMMA Thickness. PMMA thickness under different spin rates and compositions.

Figure 6:
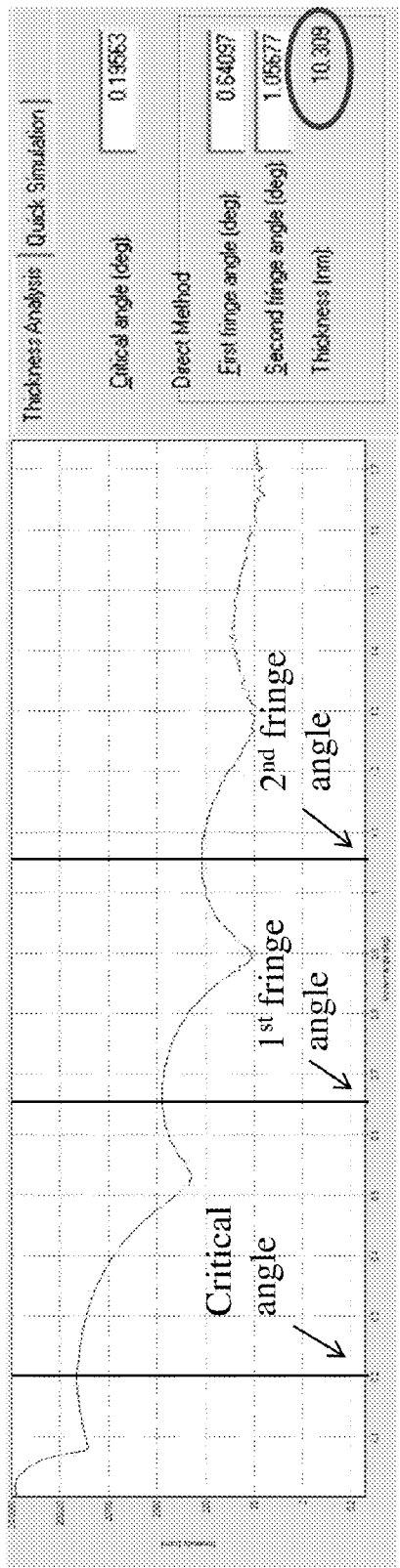

FIG. 6|GST Deposition. X-ray reflectivity (XRR) measurement of GST thin film thickness, after Refs 2,3.

Figure 7:
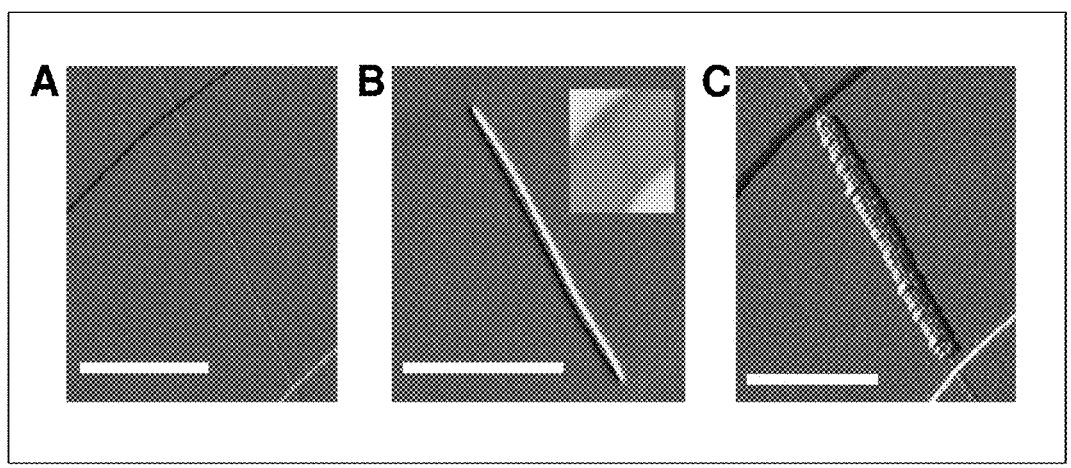

FIG. 7|AFM imaging of self-aligned CNT-NW device at various fabrication steps. A. AFM imaging of initial CNT device with a length of ~2 μm and diameter ~2.5 nm B. AFM image of the PMMA nanotrench formed along CNT due to Joule heating. The PMMA film is 50 nm thick and the trench is ~113 nm wide. The inset is an optical image of this device. C. AFM image of the self-aligned PCM nanowire after GST deposition and lift-off. The GST nanowire is 10 nm thick. The scale bars are 1 μm. Also see FIG. 1 in main text.

Figure 8:
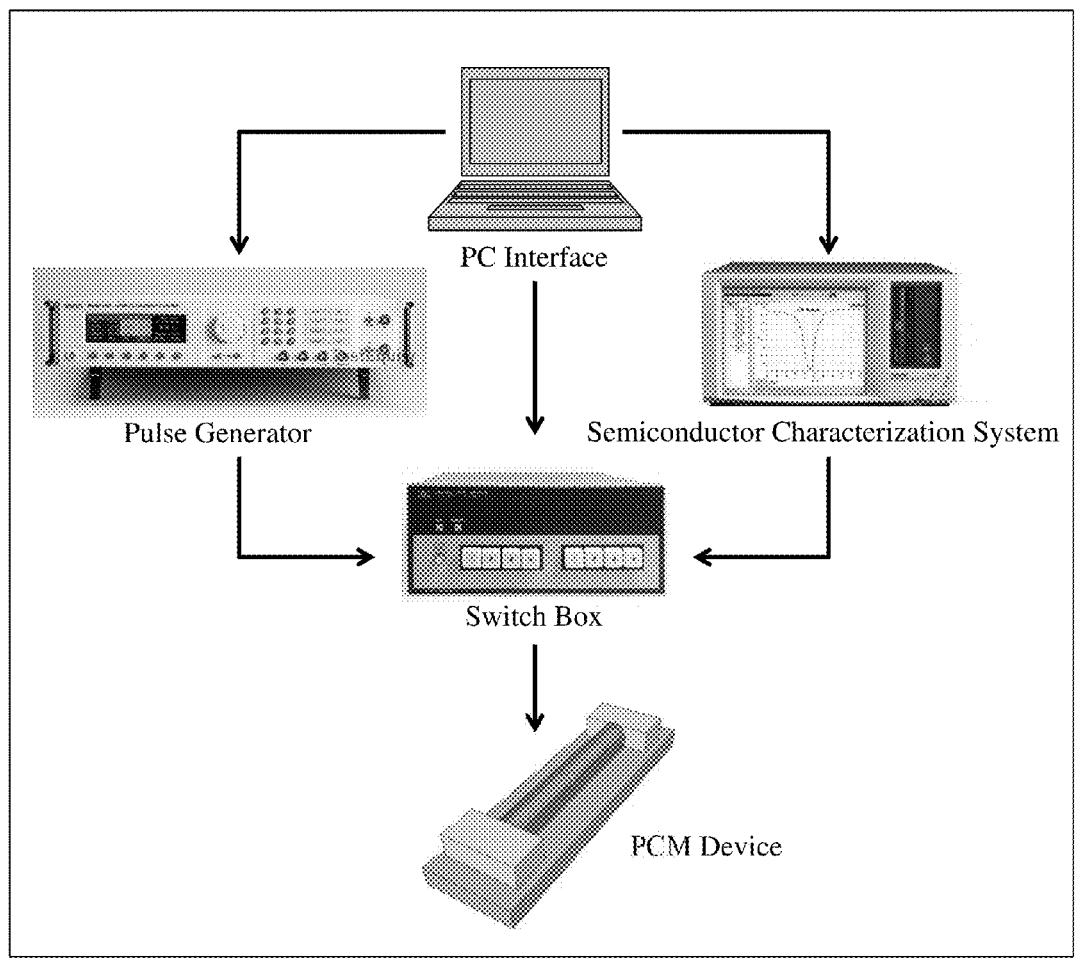

FIG. 8|Endurance Test Setup. Schematics of the memory endurance test setup.

Figure 9:
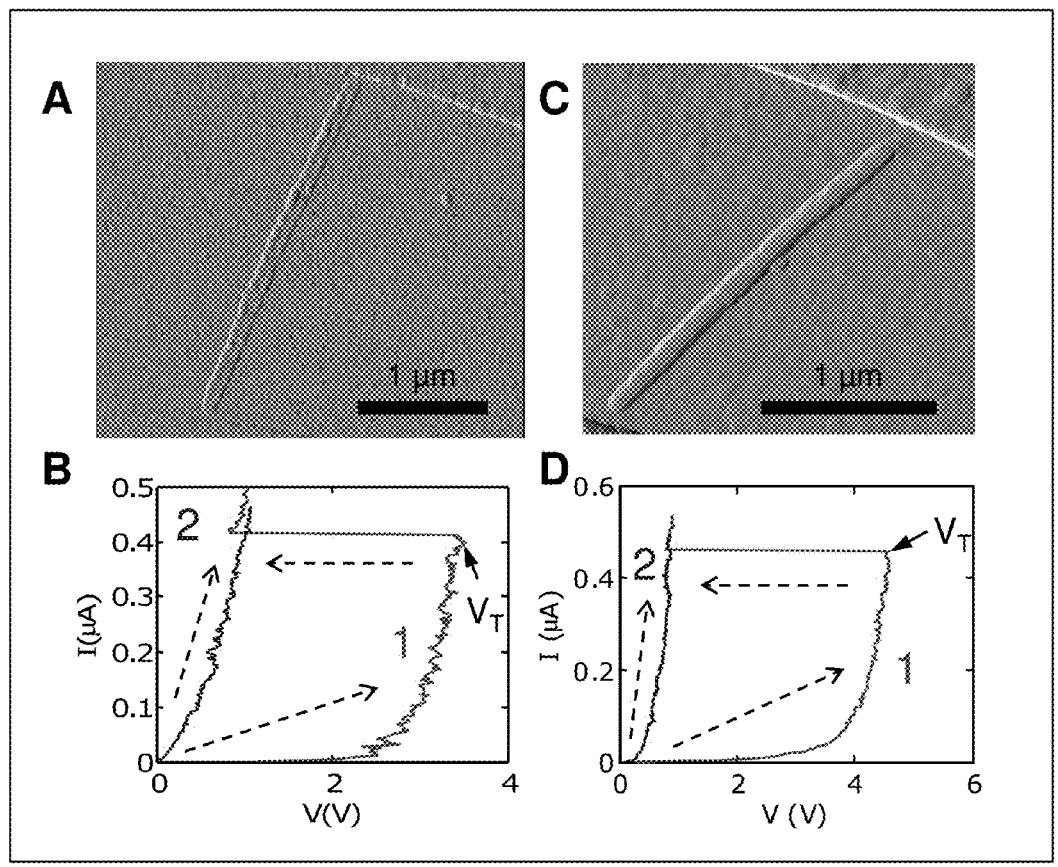

FIG. 9|Additional characterization of self-aligned PCM devices. A. AFM image of device S1, with a length of 2.80 μm, a width of 85 nm and a CNT diameter of ~2.3 nm. B. I-V characteristics of S1, demonstrating threshold switching at 3.6 V and 0.41 μA. The red curve represents the a→c phase transition; blue curve shows that the low-resistance state is preserved afterwards. C. AFM image of device S2, with a length of 2.4 μm, a width of 75 nm and a CNT diameter of ~2.1 nm. D. I-V characteristics of S2, demonstrating threshold switching at 4.5 V and 0.46 μA.

Figure 10:
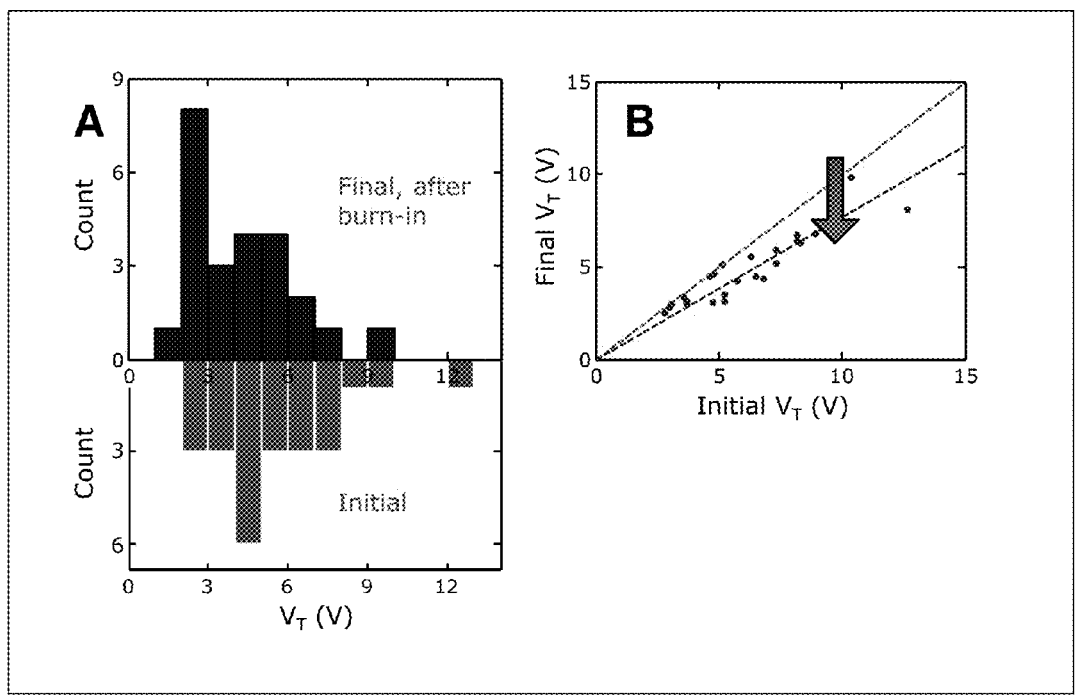

FIG. 10|Threshold voltage reduction. A. Histogram of initial $V_T$ (bottom pane) and final $V_T$ after "burn-in" (top pane) of 24 self-aligned PCM devices. B. Final $V_T$ plotted against initial $V_T$ of these devices. The blue dashed line is a linear fit with a slope of 0.77. The red dashed line has a slope of 1. The block arrow shows this average reduction in $V_T$ after burn-in.

Figure 11:
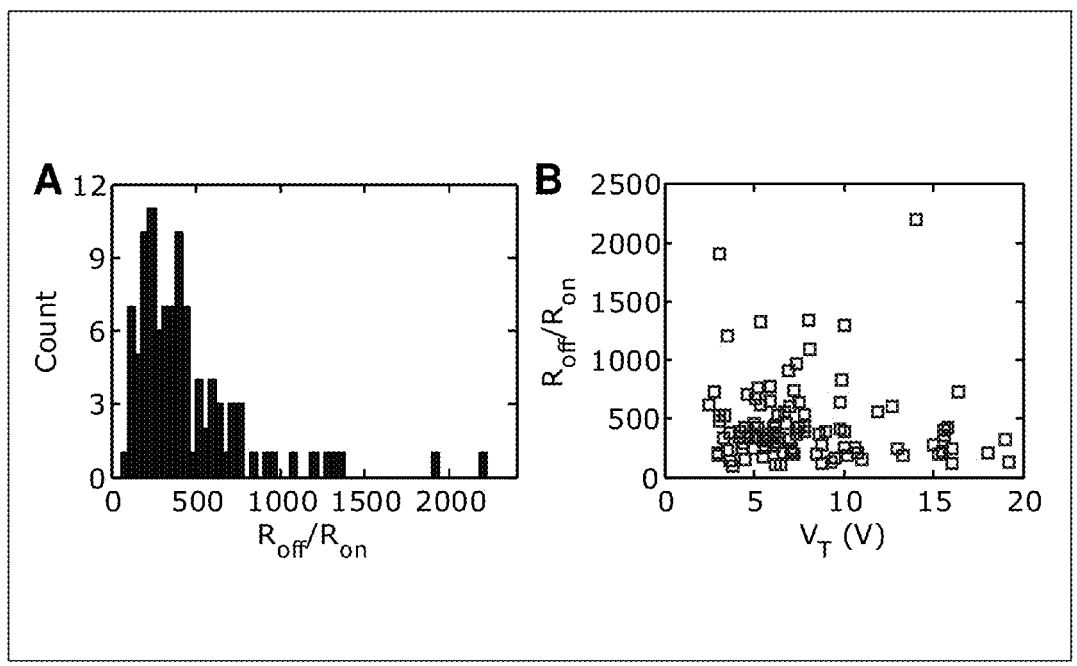

FIG. 11|Resistance off/on ratio. A. Histogram of the resistance off/on ratio of 102 self-aligned PCM NW devices. B. Off/on ratio of the 102 PCM devices plotted against their respective threshold voltage $V_T$.

Figure 12:
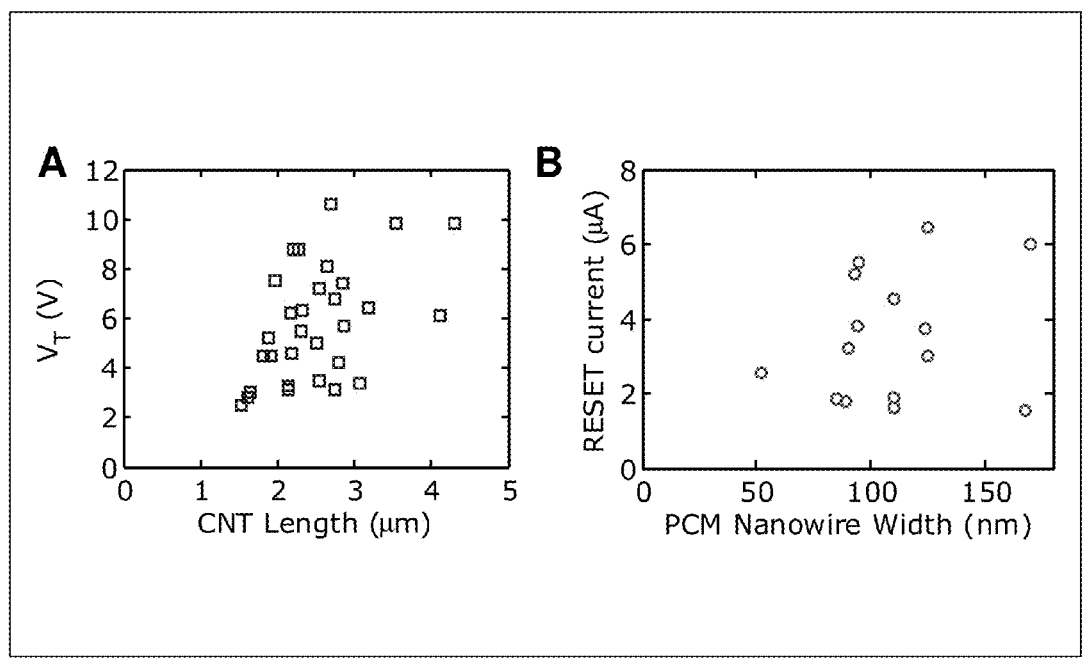

FIG. 12|Dimension dependences. A. Threshold voltage plotted as a function of the CNT length. Longer CNTs typically produce larger nanogaps upon breakdown. They also introduce slightly larger parasitic series resistance. Thus we observe a weak proportional relationship between CNT length and $V_T$. B. RESET current plotted against the PCM nanowire width. There is no obvious dependence here, suggesting the active phase region depends on the CNT electrode size rather than the actual nanowire width.

Figure 13:
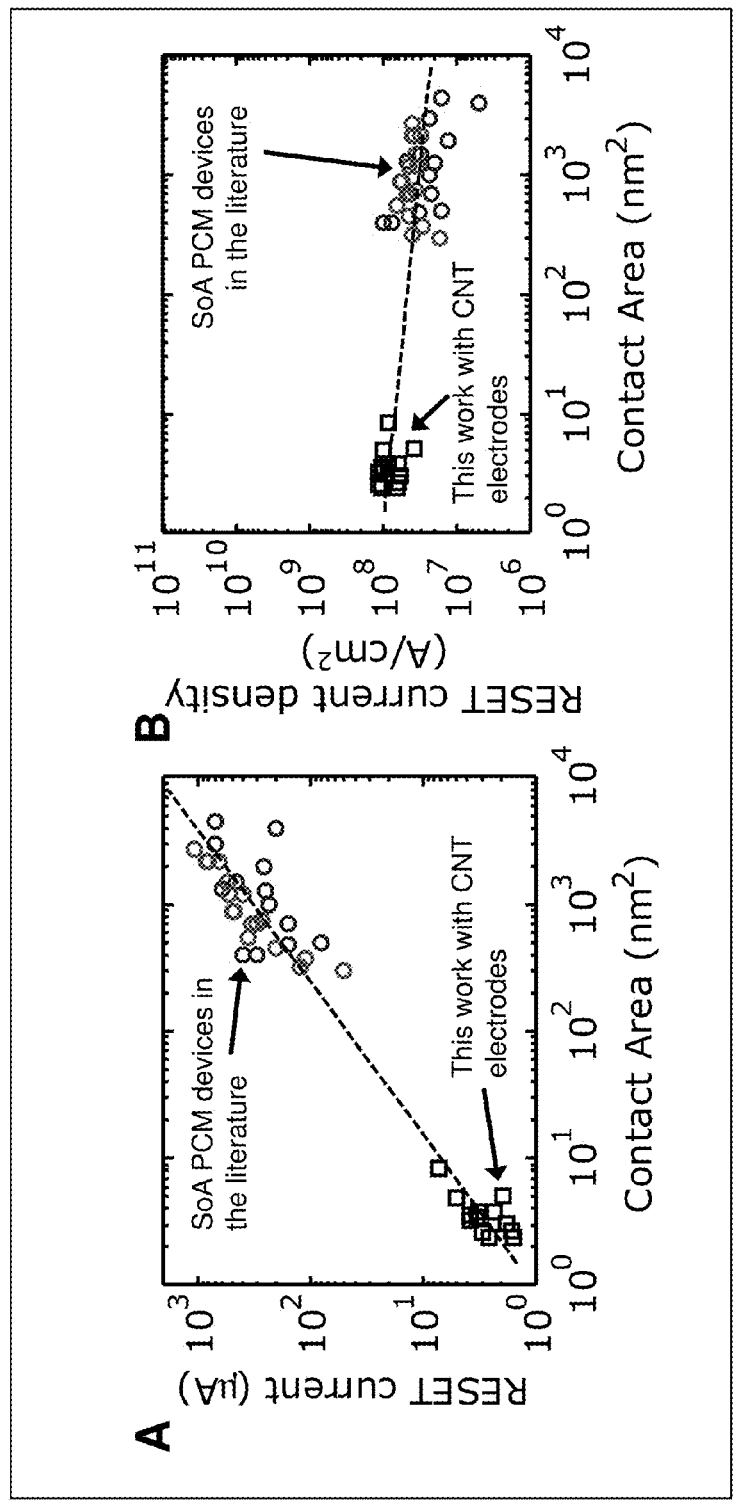

FIG. 13|PCM scaling. A. RESET current of PCM devices plotted as a function of the electrode contact area. This reveals an important scaling trend. The blue and red circles are data in the literature while the black square are data from this work. The dashed line is the best fitting power law with slope 0.83. B. RESET current densities of these devices are plotted against the electrode contact areas. The dashed line is the power law fit with slope −0.17.

Figure 14:
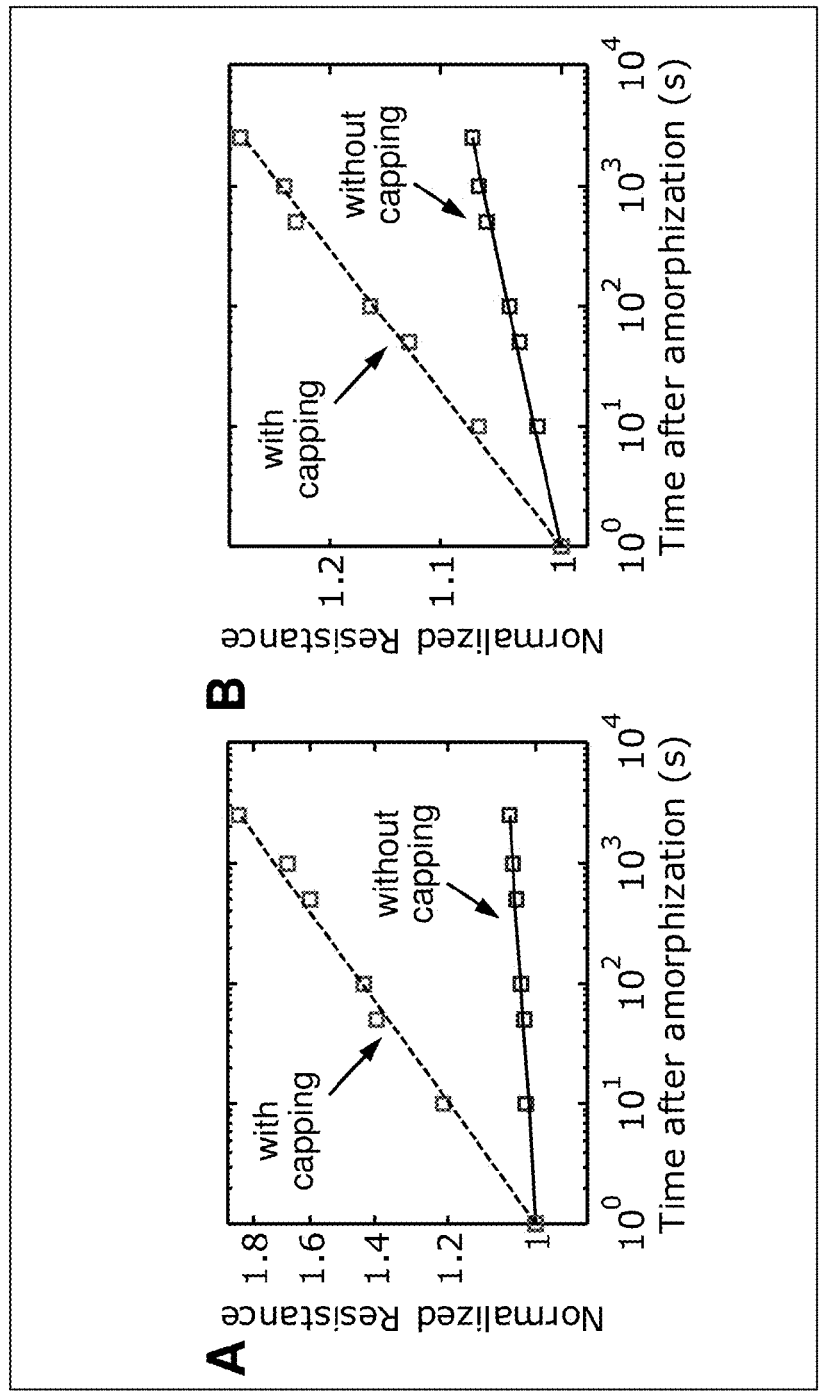

FIG. 14|Additional drift measurements. A. Resistance drift behavior of PCM nanowire devices after amorphization without (blue square) and with (red circle) a 10-nm $SiO_2$ encapsulation layer, for samples S3 (a) and S4 (b). For S3, the drift coefficients are 0.007 and 0.079 without and with capping layer. B. For S4, the drift coefficients are 0.009 and 0.032 without and with the capping layer. Also see FIG. 2f in the main text.

Figure 15:
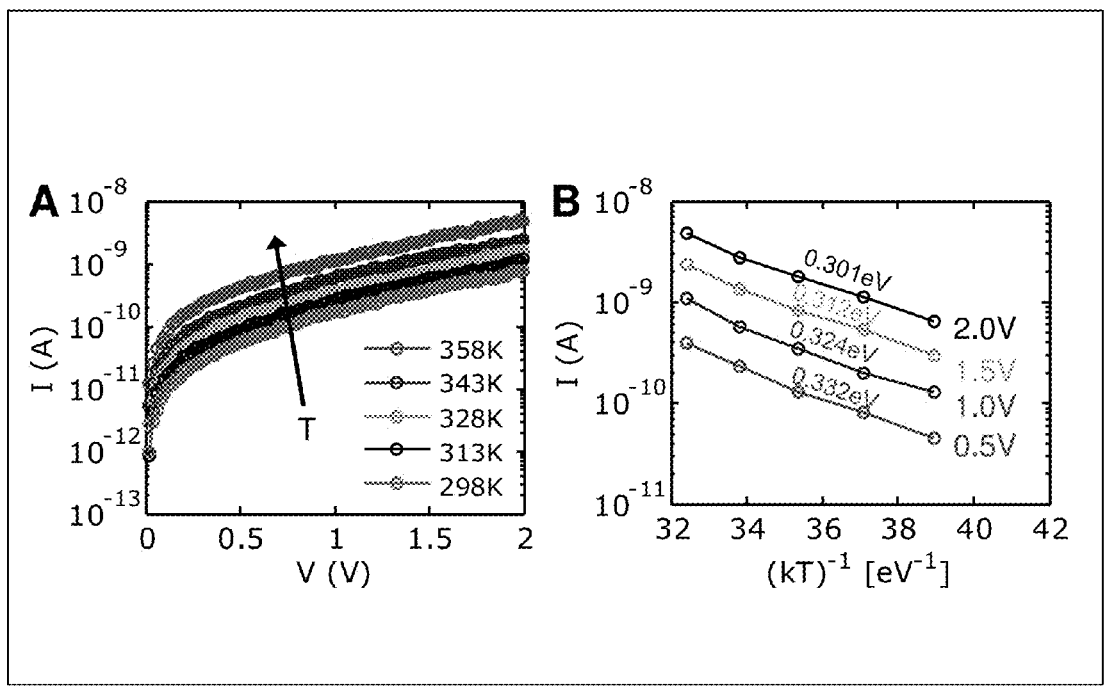

FIG. 15|Subthreshold conduction. A. Subthreshold I-V of device S3 at different temperatures. B. Extracted activation energy of S3 as a function of applied bias.

Figure 16:
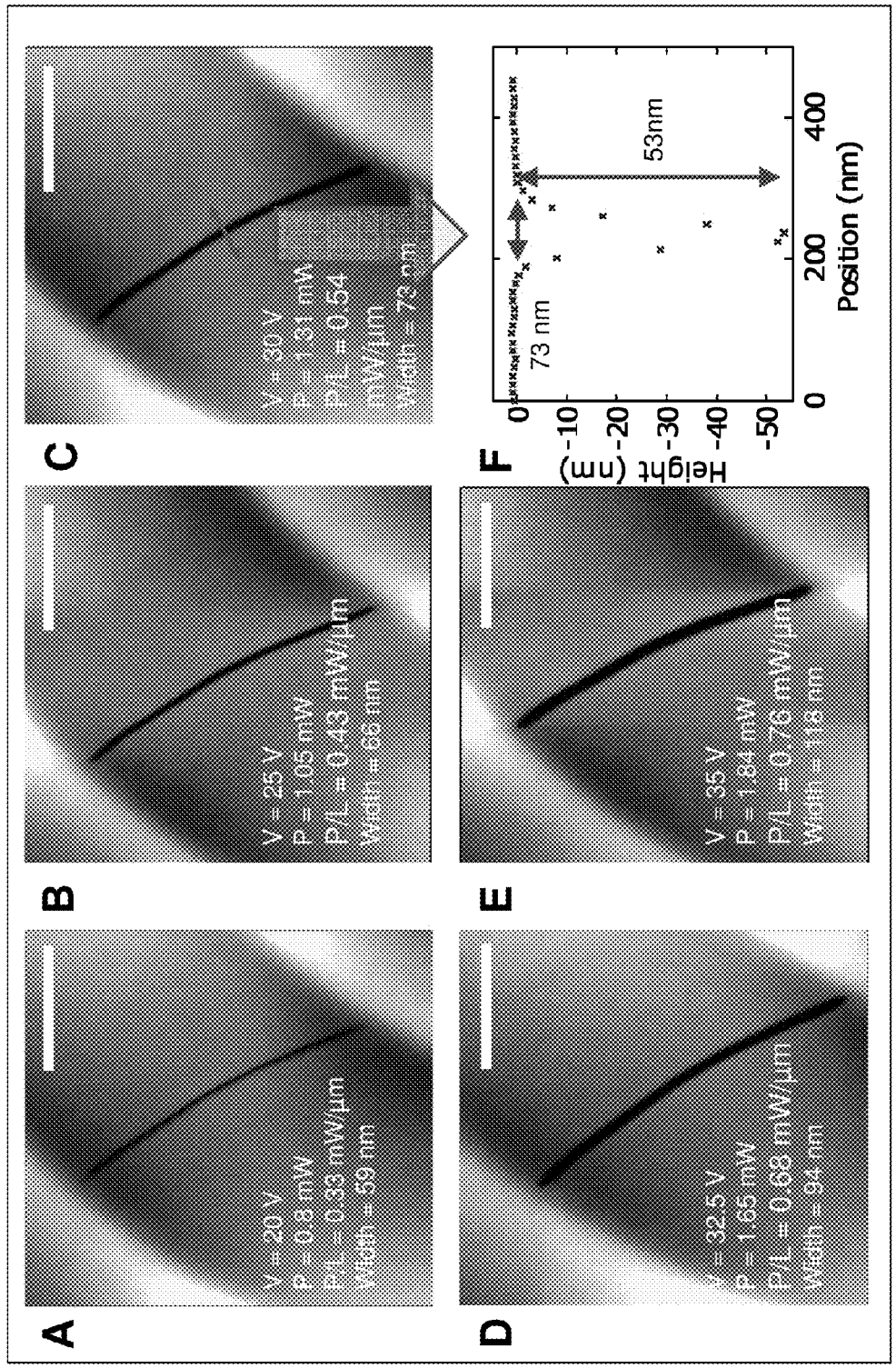

FIG. 16|Power dependence of nanotrench width. A-E. AFM images of the nanotrench in PMMA after a metallic CNT device is biased at different power levels for 5 s. The CNT has a length of ~2.4 μm and a diameter of ~2.5 nm. All electrical measurements are performed in vacuum; then the remaining PMMA was rinsed off in acetone and a fresh 50-nm thick PMMA layer was spun on the device. The scale bars are 1 μm. F. Height profile of the nanotrench by AFM measurement done on (c) in the marked region.

Figure 17:
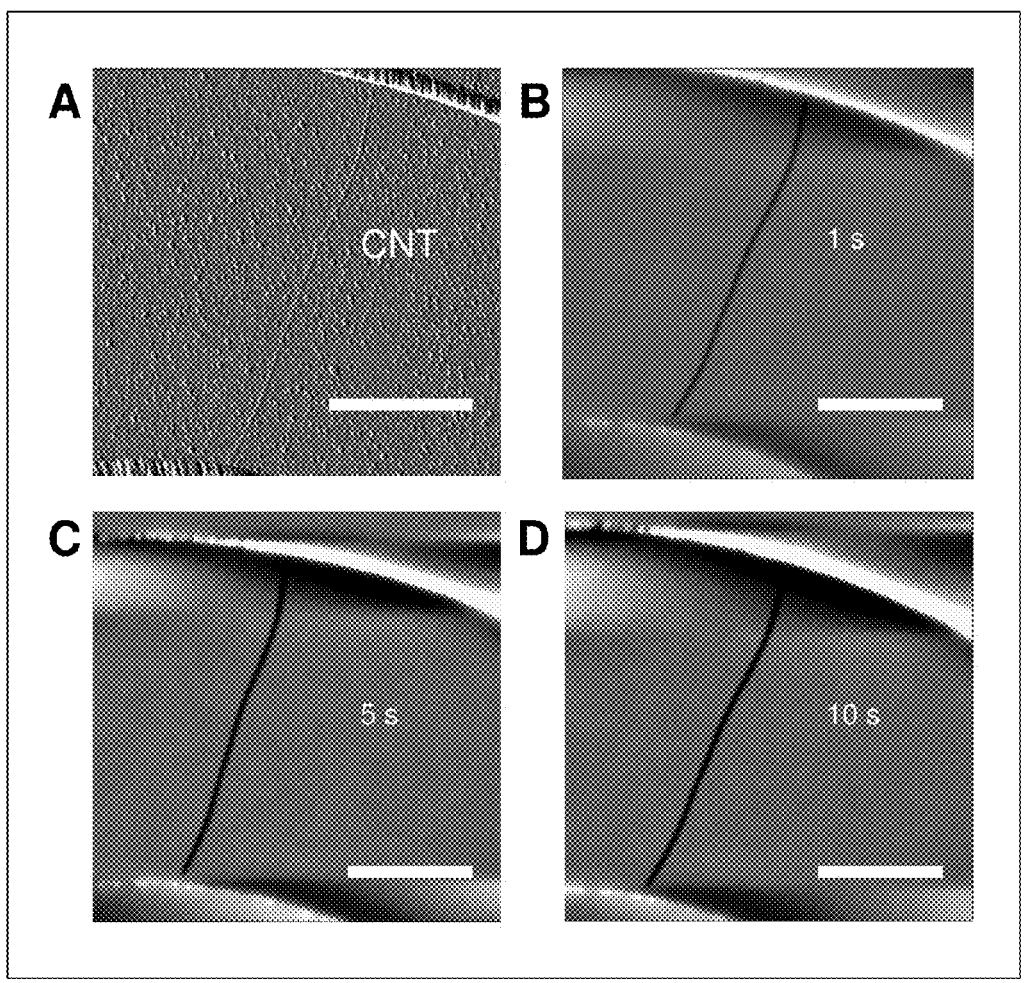

FIG. 17|Time dependence of the trench width. A-D. AFM images of the nanotrench in PMMA after the CNT device is biased at fixed power (25 V, 0.63 mW) for different durations. The metallic CNT has a length of 2.60 μm and a diameter of 2.0 nm. All measurements were done in vacuum. After each measurement, the remaining PMMA was rinsed off in acetone before a fresh 50-nm thick PMMA layer was spun onto the device. All scale bars are 1 μm.

Figure 18:
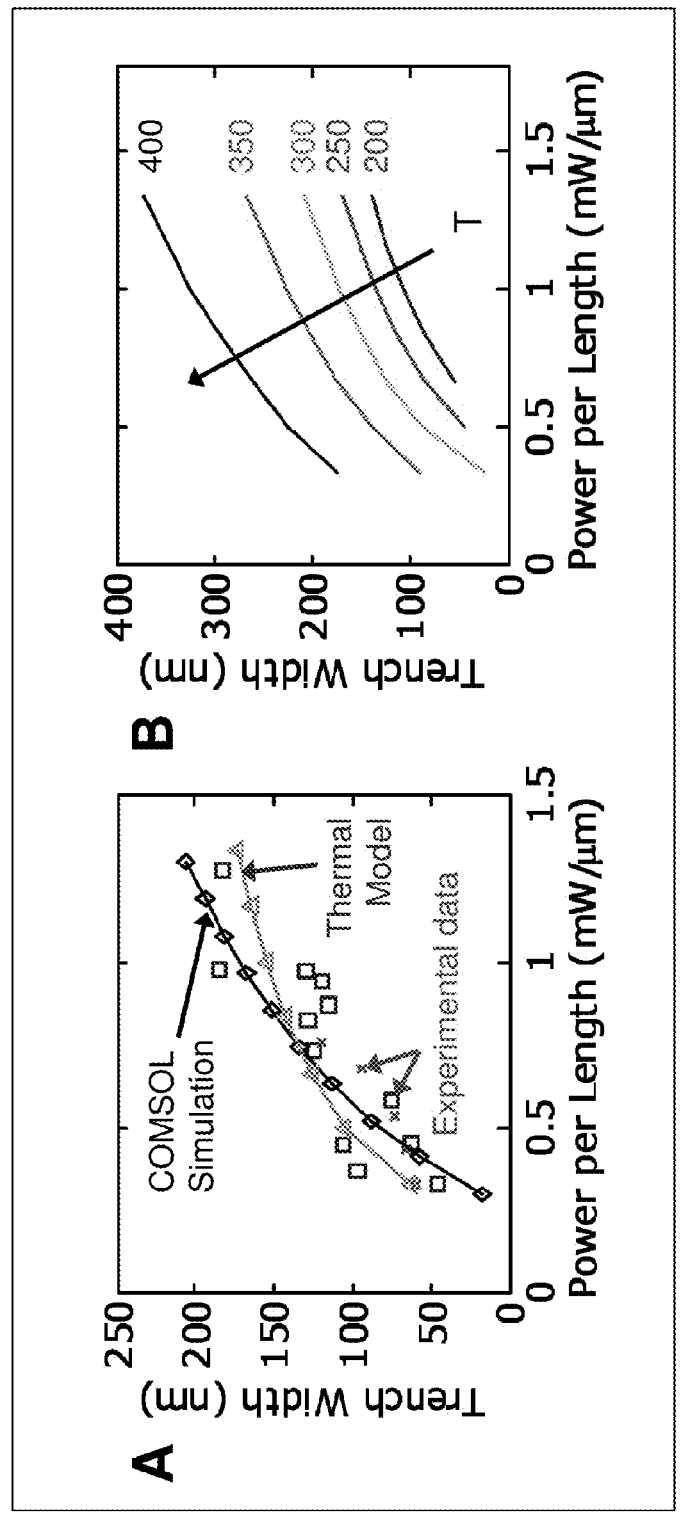

FIG. 18|Thermal modeling of nanotrench formation. A. Comparison of experimental data with analytic model (Section 6) and COMSOL finite-element simulations (Section 7). B. COMSOL finite-element simulation of variation of nanotrench width vs. input power/length at several background temperatures.

Figure 19:
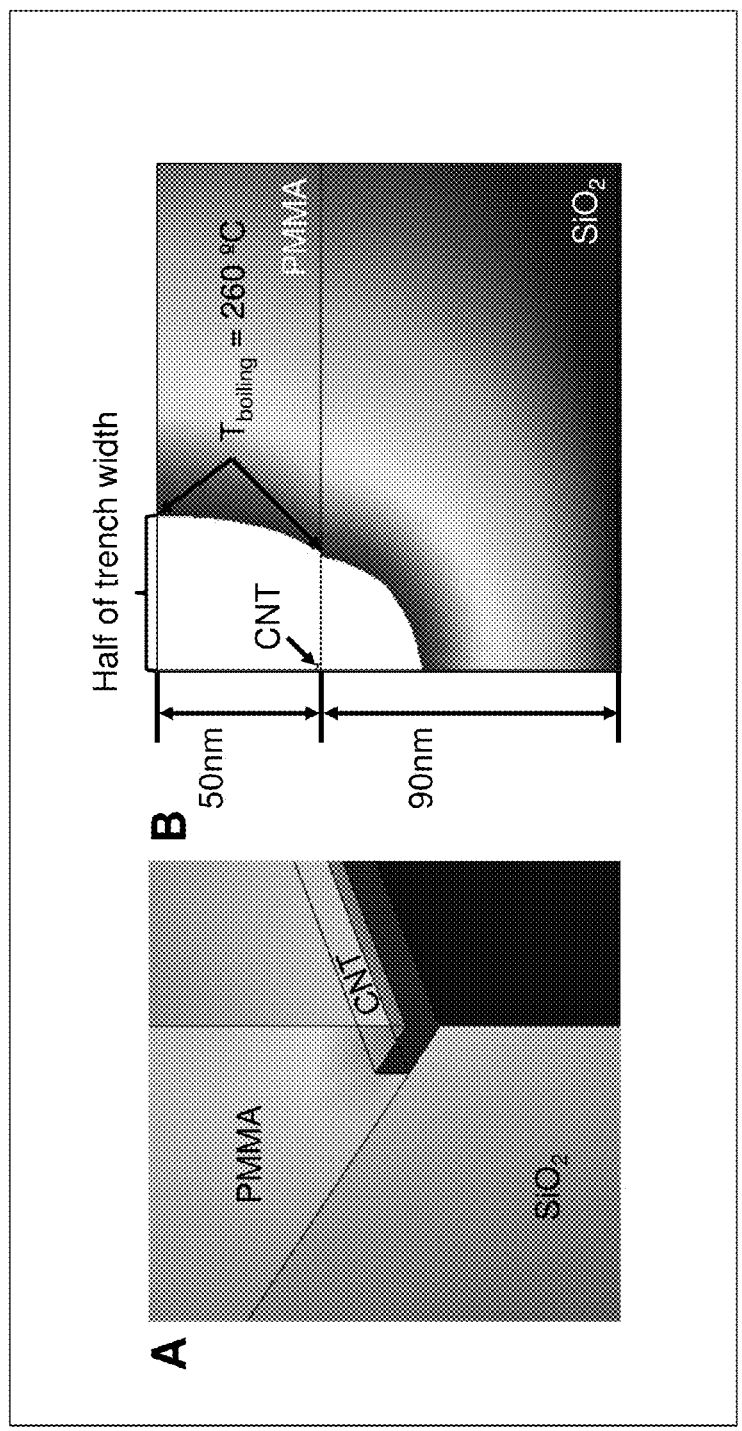

FIG. 19|COMSOL simulation model. A. Schematics of the simulated geometry. B. Temperature contour of the cross-sectional plane at the center of the CNT. The highest temperature plotted here is 260° C., roughly corresponding to the boiling point of PMMA. This allows extraction of the approximate nanotrench width, if PMMA reflow can be ignored.

Figure 20:
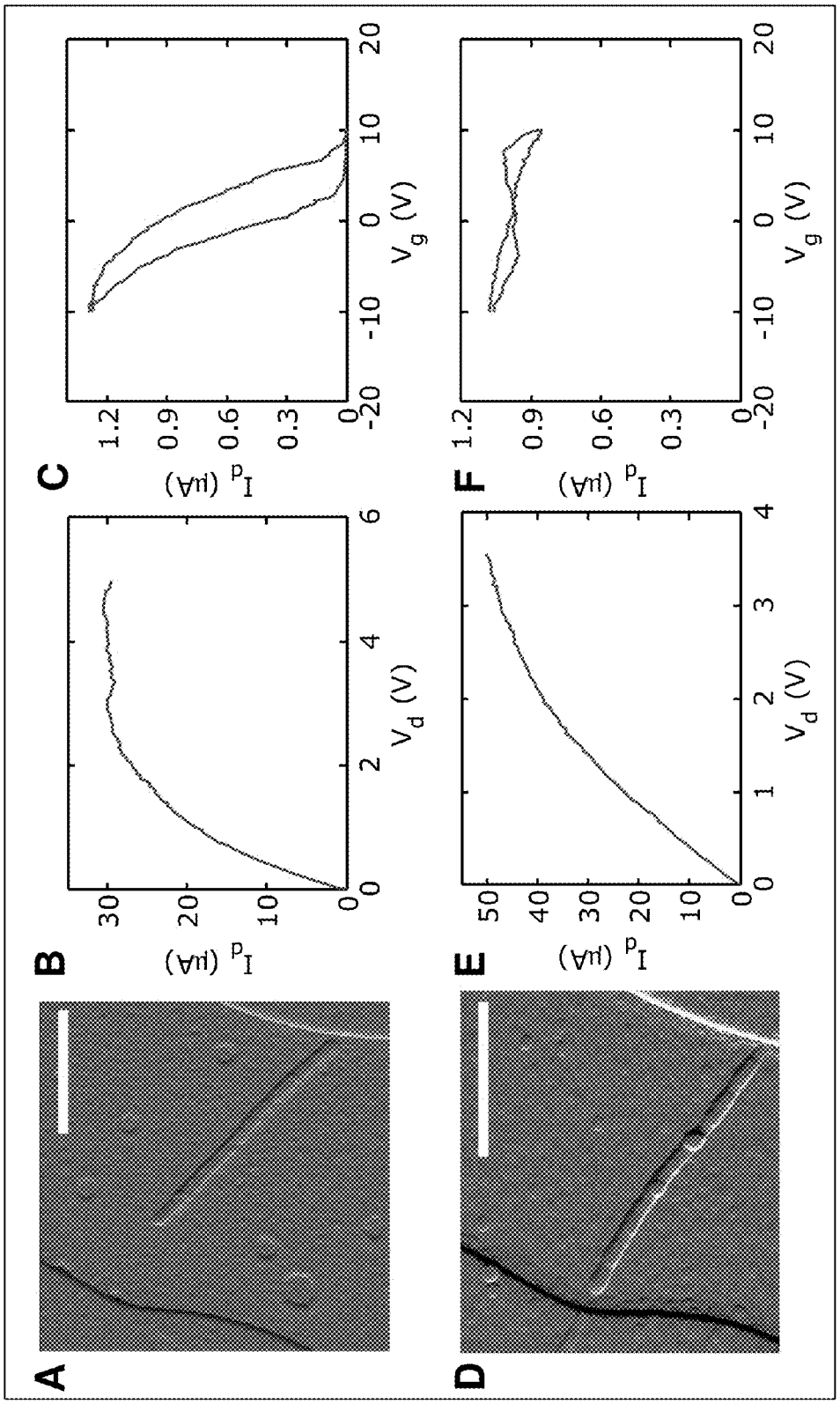

FIG. 20|Self-aligned Au nanowires. A. AFM image of self-aligned Au nanowire device, with a length of 2.82 μm, a width of 58 nm and a CNT diameter of 2.0 nm. The CNT was initially semi-conducting. B. $I_d$-$V_d$ characteristics of the device after Au deposition. C. $I_d$-$V_g$ characteristics of the device after the Au nanowire deposition. We can still observe the semi-conducting behavior of the underlying CNT. D. AFM image of another self-aligned Au nanowire device, with a length of 2.04 μm, a width of 57 nm and a CNT diameter of 2.5 nm. The CNT was initially metallic. E. $I_d$-$V_d$ characteristics of the device after Au deposition. F. $I_d$-$V_g$ characteristics of the device after the Au nanowire deposition. We can still observe the metallic behavior of the underlying CNT. The scale bars are 1 μm.

Figure 21:
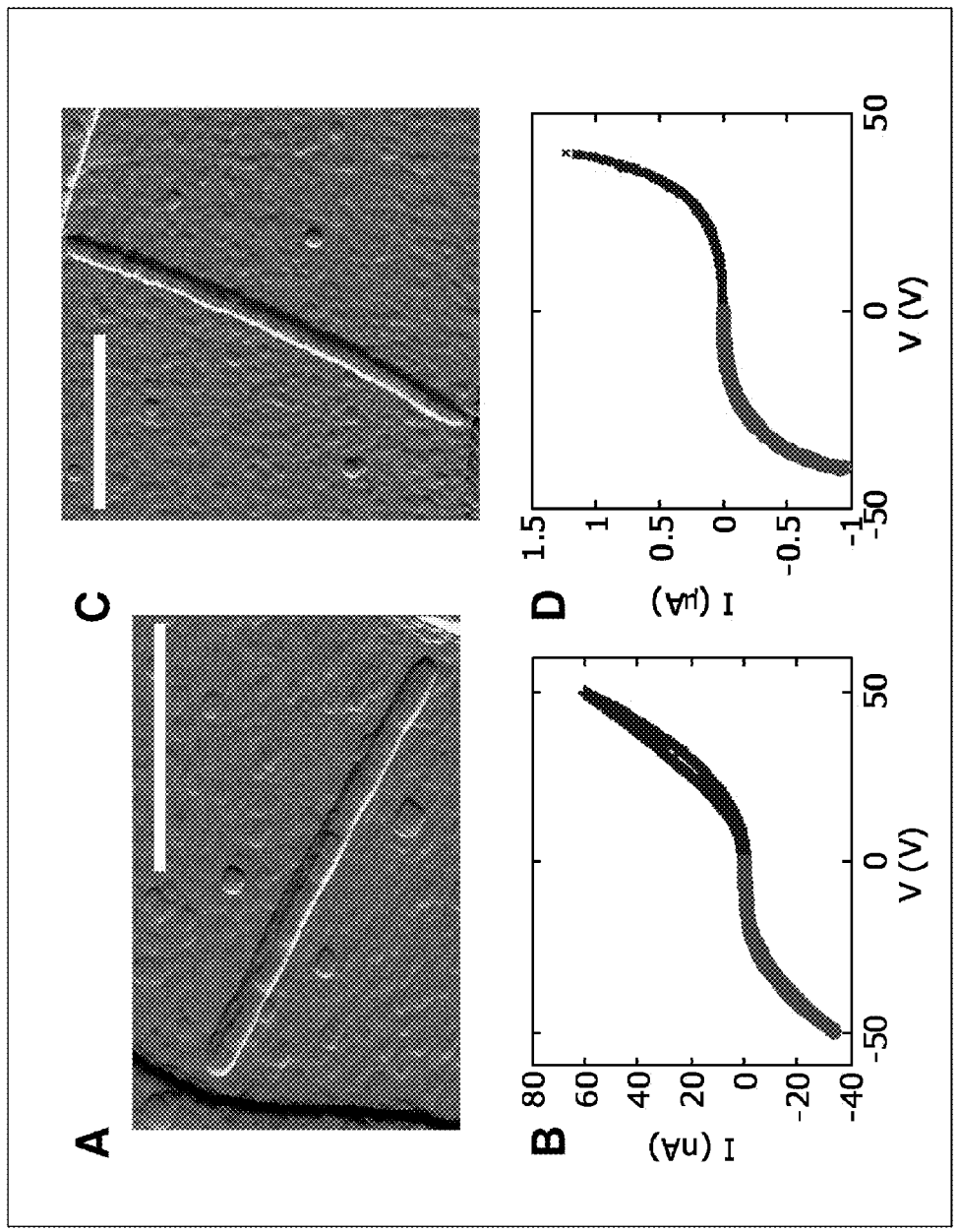

FIG. 21|Self-aligned RRAM devices. A. AFM image of self-aligned $TiO_x$ nanowire device, with a length of 2.4 μm, a width of 84 nm and a CNT diameter of ~2.2 nm. B. I-V characteristics of the $TiO_x$ nanowire device. C. AFM image of self-aligned $HfO_x$ nanowire device, with a length of 2.6 μm, a width of 63 nm and a CNT diameter of ~2.1 nm. D. I-V characteristics of the $HfO_x$ nanowire device. The scale bars are 1 μm.

Figure 22:
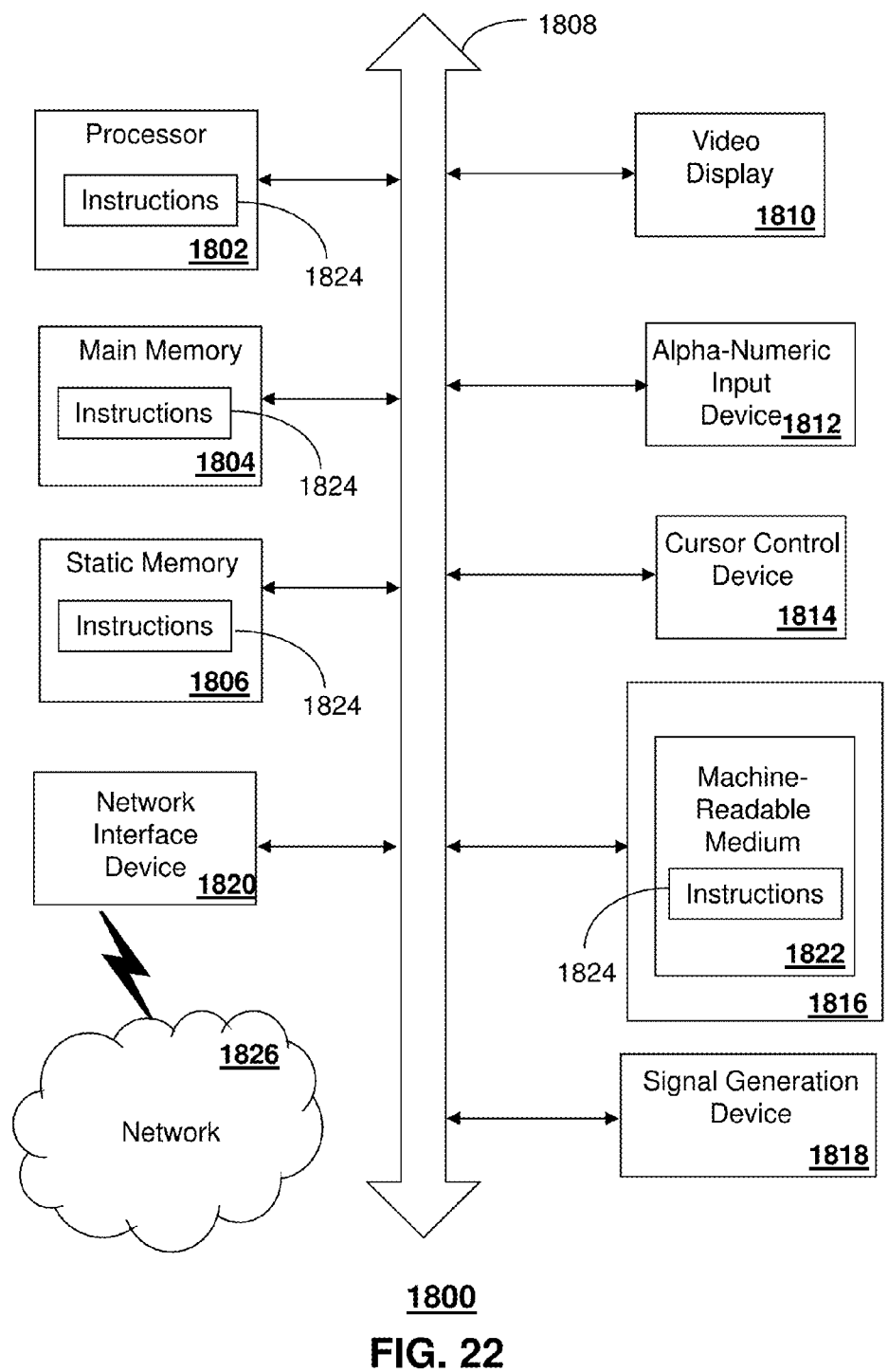

FIG. 22 depicts an illustrative diagrammatic representation of a machine in the form of a computer system within which a set of instructions, when executed, may cause the machine to perform any one or more of the methodologies disclosed herein.

DETAILED DESCRIPTION

The subject disclosure can utilize or combine some or all embodiments described in U.S. patent application Ser. No. 12/463,953, filed on May 11, 2009, entitled, "Resistive Changing Device;" and U.S. patent application Ser. No. 13/449,891, filed on Apr. 18, 2012, entitled, "Adaptive Resistive Device and Methods Thereof." The aforementioned patent applications are hereby incorporated by reference in their entirety.

One embodiment of the subject disclosure entails a method for forming a nanoelectrode, forming a first electrode coupled to a first end of the nanoelectrode, applying a voltage across the nanoelectrode and the second electrode sufficient to remove a first portion of the first material surrounding the nanoelectrode to form a trench aligned with the nanoelectrode, applying a second material to substantially cover at least one of the trench, or the trench and a remaining portion of the first material, and removing a second portion of the first material and a portion of the second material to form a nanowire comprising a remaining portion of the second material covering the nanoelectrode along the trench.

One embodiment of the subject disclosure entails a device including a first circuit component, a second circuit component, and a nanowire coupled to a first terminal of the first circuit component, and a second terminal of the second circuit component. In one embodiment, the nanowire forms a conductive channel between the first circuit component and the second circuit component. In one embodiment, the nanowire comprises a material deposited in a trench aligned with a nanoelectrode.

One embodiment of the subject disclosure entails a method for depositing a first material that substantially covers a nanoheater, applying a signal to the nanoheater to remove a first portion of the first material covering the nanoheater to form a trench aligned with the nanoheater, depositing a second material in the trench, and removing a second portion of the first material and a portion of the second material to form a nanowire comprising a remaining portion of the second material covering the nanoheater along the trench.

A central issue of nanoelectronics concerns their fundamental scaling limits, namely the smallest and most energy-efficient devices that can function reliably. Unlike charge-based electronics which are prone to leakage at nanoscale dimensions, memory devices based on phase change materials (PCMs) are more scalable, storing digital information as the crystalline or amorphous state of a material[5-7]. The most energy-efficient PCM devices to date have been achieved by confining their bit either as nanowires (NWs)[8,9,13], or by contacting the PCM with carbon nanotube (CNT) electrodes[10-12]. Here, we describe a novel approach that confines the PCM bit in three-dimensions, by combining a PCM nanowire that is self-aligned with CNT electrodes, without the need for complex lithography. Such memory bits achieve the lowest programming currents (~0.1 µA set, ~1.6 µA reset) and power consumption reported to date. The devices also offer outstanding on/off ratios (>$10^3$), approaching intrinsic switching limits of the PCM resistance, and improved endurance and stability. In addition, the powerful yet simple approach described here could enable confining and probing many other nanoscale and molecular devices self-aligned with CNT electrodes.

Here, we present a phase-change nanodevice which combines the advantages of the extremely small CNT electrodes with the lateral constriction of NWs, to achieve confinement of the PCM bit in three-dimensions. The nanodevice displays ultra-low power operation and electrical characteristics (e.g. on/off ratio) that approach the ultimate limits of the PCM. The simple nanofabrication technique does not require lithography to self-align PCM nanowires with CNT electrodes, and can be easily adapted to confine and probe many other nanoscale materials and devices. FIG. 1 presents a schematic of our approach and atomic force microscopy (AFM) images of a device at different fabrication stages. We begin with a CNT spanning two Pd electrodes[17] on a $SiO_2$/Si substrate, as shown in FIGS. 1a-b and further described in the Methods and Supplement. CNTs are either single-wall or small-diameter (d<5 nm) multi-wall, and both types can be used in the fabrication and devices described here. We spin a thin layer of polymethyl methacrylate (PMMA), typically ~50 nm onto the device (FIG. 1c). We then apply a voltage across the Pd pads in vacuum (~$10^{-5}$ Torr) such that localized Joule heating within the CNT causes the PMMA covering it to evaporate[12,18], leaving behind a narrow trench self-aligned with the CNT (FIGS. 1d-e).

We then create a nanogap (~20 to 150 nm) in the exposed CNT by electrical breakdown[10,17] at high bias in air under Ar flow (FIG. 1f). The size of this nanogap can be controlled by the partial pressure of $Ar/O_2$ available[19], although nanogaps can also be created by other techniques such as atomic force microscopy (AFM) or electron-beam "cutting" of CNTs[20]. We then deposit ~10 nm of GST over the device by sputtering, filling the nanogap and nanotrench as shown in FIG. 1g. We lift-off the remaining PMMA (see Methods), leaving behind a GST NW that spans the nanogap and is perfectly aligned with the CNT electrodes (FIG. 1h-i). Most devices were capped with ~10 nm evaporated $SiO_2$ to protect the GST from oxidation; some were left uncapped to characterize the effect of this encapsulation on device reliability at such diminutive bit dimensions. As shown in FIG. 1J, the self-aligned device can comprise a first circuit component 150, a second circuit component 151, and a nanowire 101 coupled to a first terminal of the first circuit component, and a second terminal of the second circuit component. The nanowire 101 can form a conductive channel between the first circuit component 150 and the second circuit component 151. The nanowire 101 can comprise a material deposited in a trench aligned with a nanoelectrode. The nanoelectrode can be one of a nanotube or a grapheme ribbon, where the material is a conductive material. The first circuit component 150 can be a first transistor, and the second circuit component 151 can be a second transistor. The first terminal of the first circuit component 150 can be a drain terminal, a source terminal, or a gate terminal of a first transistor. The second terminal of the second circuit component 151 can be one of a drain terminal, a source terminal, or a gate terminal of the second transistor.

The AFM image and electrical characteristics of a device are shown in FIG. 2 (also see FIGS. 9A-D). FIG. 2B shows current-voltage (I-V) characteristics under dc current sweep, demonstrating memory SET switching from the high resistance amorphous phase ($R_{OFF}$~2.5 GΩ) to the low-resistance crystalline phase ($R_{ON}$~1.3 MΩ). The SET switching is initiated at a threshold voltage ($V_T$) through a field-induced transition of the amorphous phase[21]; Joule heating then heats up (~150° C.) and crystallizes the bit into the conductive state. The $V_T$ of our devices decreases by 20-30% after the first few switching cycles (FIG. 2B and Supplement FIG. 10), which is consistent with previous reports[10,11]. This "burn-in" is beneficial as it stabilizes the memory bit and allows lower power operation in the long run. Reversible memory switching is achieved with pulsed operation and shown in FIG. 2C. The bit is re-amorphized (RESET) with a current pulse which heats up the crystalline GST (c-GST) to its melting point (~620° C.) then quenches it back to a disordered amorphous GST (a-GST) state during the short falling edge of the pulse. This device has $R_{OFF}/R_{ON}$~2000, effectively approaching the intrinsic resistivity ratio of a-GST and c-GST ($\rho_a/\rho_c$~$10^3$-$10^4$) much closer than previous reports[10,11].

The self-aligned structure presents several benefits which allow us to approach the fundamental limits of switching in such small PCM bits. The narrow constriction of the self-aligned NW (FIG. 2A inset) enables the ultra-high off/on ratio by eliminating parasitic leakage paths that could shunt the small PCM bit. The NW constriction also improves device endurance (FIG. 2D) compared to previous results with CNT electrodes[10,11], by limiting the size of the so-called crystalline "halo" that can form around the bit region[22] after several switching events. The programming currents are reduced by ~100× compared to industrial state of the art[16,23] by the use of CNT electrodes which have much smaller diameter (~2 nm) than typical metal electrodes (~20 nm); in addition, the combination of CNT electrodes and narrow NW constriction further reduces programming current by 3-5× with respect to devices which utilized CNT electrodes alone[10].

FIG. 2E shows that both memory states are stable under constant 1 V readout for $10^4$ s at room temperature (FIG. 2E), equivalent to $10^{11}$ cycles of 100-ns read operations. Another important figure of merit for PCM devices is their stability over time; the a-GST resistance can drift as $R(t)=R(t_0)(t/t_0)^\alpha$ likely due to structural relaxation[6,24,25] with typical drift coefficient $\alpha$=0.05-0.1. In FIG. 2F we find that the drift coefficient of a self-aligned NW without capping is extremely low (~0.006), and it is slightly higher (~0.062) with ~10-nm of $SiO_2$ encapsulation, consistent with previous findings[24]. The higher drift slope could be due to enhanced mechanical stress in the encapsulated NW[24] or to a change in GST composition affecting the band structure and the drift properties[26]. Coupled with the extremely high off/on ratio, such low drift coefficients could enable multilevel memory applications even at the most reduced bit dimensions[6,7].

FIG. 3A displays the measured $R_{ON}$ and $R_{OFF}$ of 102 self-aligned devices vs. threshold voltage, chosen as the stable $V_T$ after "burn-in" of the first cycles. The mean ratio $R_{OFF}/R_{ON}$ is about 900 for all measured devices, however some reach ~2000 as noted earlier. The measured resistance is effectively that of the PCM bit in the nanogap, which is more resistive than the CNT electrodes regardless of phase. Thus, we can expect a linear scaling of R vs. $V_T$, both being proportional to the nanogap size formed between the CNT electrodes[10,21]. The solid (dashed) line in FIG. 3A is a linear fit of $R_{ON}$ ($R_{OFF}$) vs. $V_T$ with a slope 0.5 M$\Omega$/V (110 M$\Omega$/V) and intercept 720 k$\Omega$ (630 M$\Omega$). The 720 k$\Omega$ intercept in the on-state is larger than typical CNT resistance[14,17] (~100 k$\Omega$), suggesting that both the CNT-metal and CNT-GST contact interfaces could be further improved, leading to potentially even higher off/on ratios. The slope can be used to estimate the approximate bit cross-sectional area A~2-20 nm$^2$, which is smaller than the NW cross-section thus suggesting filamentary conduction between the CNT electrode tips[10,11].

FIG. 3B also shows that the RESET and SET currents scale approximately with the electrode tip area, estimated as $\pi d^2/4$ where d is the CNT diameter. The self-aligned device with 1.7-nm diameter CNT electrodes has $I_{RESET}$~1.6 μA, which represents one of the lowest currents measured[10,11] for nanoscale PCM (also see scaling trend in FIG. 12). The estimated energy per bit during SET is ~30 fJ and during RESET ~80 fJ, the latter being limited by the approximately ~30-ns pulse widths used in our setup, which in principle could be reduced by another order of magnitude. Such extremely low energy consumption may allow for high-density, energy-saving solid-state storage for portable devices and data servers.

We now turn to the broader applications of our self-aligned fabrication method. Beyond studying the fundamental limits of PCMs, this powerful yet simple lithography-free technique could be used to probe other nanomaterials by automatically aligning them with CNT electrodes. For instance, this approach could enable study of precisely positioned nanoparticles[27], individual molecules[28] or DNA strands[29]. FIG. 4A-C show how nanotrench width (and subsequent NW) can be tuned by the power input to the CNT heater during trench formation. Biasing the CNT for 5 s at room temperature in vacuum with input power 0.80, 1.31 and 1.84 mW, yielded nanotrench W~59, 73 and 118 nm, respectively. FIG. 4D shows 17 nanotrench widths as a function of the CNT input power, compared to the results of a computational model. Two examples of other NWs (Au and $TiO_x$) self-aligned with CNTs through the same process are shown in FIGS. 4E-F, and more are given in FIG. 18. We have been able to fabricate NWs down to ~40-nm wide, and our simulations suggest widths near ~10 nm could be achieved by decreasing the PMMA thickness, lowering the background temperature or using pulsed heating.

In summary, we developed a novel technique to fabricate sub-50-nm NWs that are self-aligned to CNT electrodes without the need for complex lithography. This enabled us to study PCM devices with bits of a few hundred cubic nanometers, confined by the CNT nanogap and NW width. Such self-aligned PCM devices show small power consumption, improved endurance, and extremely high off/on ratio approaching the intrinsic limits of the PCM. The powerful yet simple nanopatterning method could also serve as an excellent platform to study other nanoelectronic and molecular devices and materials self-aligned with CNT electrodes.

Methods

Device Fabrication. Carbon nanotubes (CNTs) are grown by chemical vapor deposition (CVD) from Fe catalyst on $SiO_2$(90 nm)/Si substrates. Metal contacts were deposited by successive electron-beam (e-beam) evaporation of Ti/Pd/Au (0.5/20/20 nm). Devices were annealed in vacuum or Ar flow at 300-400° C. for an hour after metal deposition to improve contact resistance. For nanotrench formation, PMMA 495 A2 (from MicroChem) was spun onto the device, usually at 4500 rpm. PMMA thickness was measured by ellipsometry. The nanogaps in CNTs were formed by electrical cutting in air ambient under Ar flow nozzle. GST was deposited by DC sputtering under 3 mTorr of Ar flow, with a deposition rate of 0.1 Å/s. GST film thickness (~10 nm) was confirmed by both AFM and X-ray reflectivity (XRR) measurements. Sputtering power was kept minimal (~7 mW) for better lift-off results. Lift-off was performed in acetone solution, with mild sonication (5~10 s) typically used to achieve cleaner results. To test for leakage, we also performed control experiments on CNTs without GST, which did not switch reversibly.

Electrical and AFM Measurements. Electrical measurements were performed with a Keithley 4200 Semiconductor Characterization System (SCS), a Keithley 3402 Pulse Generator, a Hewlett-Packard 59307A VHF switchbox and an Agilent InfiniiVision MSO7104A oscilloscope. Some electrical measurements were performed in vacuum in a Janis ST-100-UHV-4 probe station equipped with a heating stage (up to 650 K). Threshold voltages ($V_T$) were determined from dc current sweeps with 40 V compliance. Reversible SET/RESET programming was performed with pulsed voltages. The pulse current amplitudes were calculated from the applied voltage and the device resistance. The endurance measurements were automated via LabVIEW scripts. AFM measurements of CNT length, diameter, and device topography were performed with a MFP3D Asylum. Most AFM measurements were done in air in tapping mode scan with a silicon tip of initial radius ~7 nm. The scan rate is typically 3-5 μm/s.

REFERENCES

1. Wuttig, M. & Yamada, N. Phase-change materials for rewriteable data storage. *Nature Materials* 6, 824-832 (2007).
2. Bun, G. W. et al. Phase change memory technology. *Journal of Vacuum Science & Technology B* 28, 223-262 (2010).
3. Wong, H. S. P. et al. Phase Change Memory. *Proceedings of the IEEE* 98, 2201-2227 (2010).
4. Lee, S.-H., Jung, Y. & Agarwal, R. Highly scalable non-volatile and ultra-low-power phase-change nanowire memory. *Nature Nanotechnology* 2, 626-630 (2007).
5. Meister, S., Schoen, D. T., Topinka, M. A., Minor, A. M. & Cui, Y. Void Formation Induced Electrical Switching in Phase-Change Nanowires. *Nano Letters* 8, 4562-4567 (2008).

6. Yu, D., Brittman, S., Lee, J. S., Falk, A. L. & Park, H. Minimum Voltage for Threshold Switching in Nanoscale Phase-Change Memory. *Nano Letters* 8, 3429-3433 (2008).
7. Xiong, F., Liao, A. & Pop, E. Inducing chalcogenide phase change with ultra-narrow carbon nanotube heaters. *Applied Physics Letters* 95, 243103 (2009).
8. Xiong, F., Liao, A. D., Estrada, D. & Pop, E. Low-Power Switching of Phase-Change Materials with Carbon Nanotube Electrodes. *Science* 332, 568-570 (2011).
9. Liang, J., Jeyasingh, R. G. D., Chen, H.-Y. & Wong, H.-S. P. A 1.4 µA Reset Current Phase Change Memory Cell with Integrated Carbon Nanotube Electrodes for Cross-Point Memory Application. *IEEE Symp. VLSI Tech. Dig.*, 100-101 (2011).
10. Khajetoorians, A. A., Wiebe, J., Chilian, B. & Wiesendanger, R. Realizing All-Spin-Based Logic Operations Atom by Atom. *Science* 332, 1062-1064 (2011).
11. McCamey, D. R., Van Tol, J., Morley, G. W. & Boehme, C. Electronic Spin Storage in an Electrically Readable Nuclear Spin Memory with a Lifetime>100 Seconds. *Science* 330, 1652-1656 (2010).
12. Borghetti, J. et al. 'Memristive' switches enable 'stateful' logic operations via material implication. *Nature* 464, 873-876 (2010).
13. Waser, R. & Aono, M. Nanoionics-based resistive switching memories. *Nature Materials* 6, 833-840 (2007).
14. Pop, E. Energy Dissipation and Transport in Nanoscale Devices. Nano Research 3, 147-169 (2010).
15. Chua, E. K. et al. Low resistance, high dynamic range reconfigurable phase change switch for radio frequency applications. *Applied Physics Letters* 97, 183506 (2010).
16. Kang, M. J. et al. PRAM Cell Technology and Characterization in 20 nm Node Size. *IEEE IEDM Tech. Dig.*, 39-42 (2011).
17. Liao, A. D. et al. Thermal dissipation and variability in electrical breakdown of carbon nanotube devices. *Physical Review B* 82, 205406 (2010).
18. Jin, C. Y., Li, Z. Y., Williams, R. S., Lee, K. C. & Park, I. Localized Temperature and Chemical Reaction Control in Nanoscale Space by Nanowire Array. *Nano Letters* 11, 4818-4825 (2011).
19. Qi, P. et al Miniature Organic Transistors with Carbon Nanotubes as Quasi-One-Dimensional Electrodes. *J. Am. Chem. Soc.* 126, 11774 (2004).
20. Thiele, C. et al. Controlled fabrication of single-walled carbon nanotube electrodes by electron-beam-induced oxidation. *Applied Physics Letters* 99, 173105 (2011).
21. Ielmini, D. Threshold switching mechanism by high-field energy gain in the hopping transport of chalcogenide glasses. *Physical Review B* 78, 035308 (2008).
22. Bichet, O., Wright, C. D., Samson, Y. & Gidon, S. Local characterization and transformation of phase-change media by scanning thermal probes. *Journal of Applied Physics* 95, 2360-2364 (2004).
23. Servalli, G. A 45 nm Generation Phase Change Memory Technology. *IEEE IEDM Tech. Dig.*, 113-116 (2009).
24. Mitra, M., Jung, Y., Gianola, D. S. & Agarwal, R. Extremely low drift of resistance and threshold voltage in amorphous phase change nanowire devices. *Applied Physics Letters* 96, 222111 (2010).
25. Li, J. et al. Explore Physical Origins of Resistance Drift in Phase Change Memory and its Implication for Drift-Insensitive Materials. *IEEE IEDM Tech. Dig.*, 291-294 (2011).
26. Boniardi, M., and Ielmini, D. Physical origin of the resistance drift exponent in amorphous phase change materials. *Appl. Phys. Lett.* 98, 243506 (2011).
27. Lin, Y. C., Bai, J. W. & Huang, Y. Self-Aligned Nanolithography in a Nanogap. *Nano Letters* 9, 2234-2238 (2009).
28. Guo, X. et al. Covalently Bridging Gaps in Single-Walled Carbon Nanotubes with Conducting Molecules. *Science* 311, 356-359 (2006).
29. Venkatesan, B. M. et al. Stacked Graphene-$Al_2O_3$ Nanopore Sensors for Sensitive Detection of DNA and DNA-Protein Complexes. *ACS Nano* 6, 441-450 (2011).

1. Fabrication of Carbon Nanotube Devices

Carbon nanotubes (CNTs) were grown by chemical vapor deposition (CVD) using a mixture of $CH_4$ and $C_2H_4$ as the carbon feedstock, and $H_2$ as the carrier gas at 900° C.[30]. Fe (~2 Å thick deposited by e-beam evaporation) is used as the catalyst for CNT growth. The catalyst was deposited on ~90 nm thick $SiO_2$ and highly p-doped Si wafers. Patterned catalyst islands are formed using photolithography and lift-off. Prior to growth, the catalyst was annealed at 900° C. in Ar environment to ensure the formation of Fe nanoparticles, from which the CNTs grow. The flow rate of $CH_4$ to $C_2H_4$ was kept large (~50:1) to grow predominantly single-walled CNTs or small-diameter (<5 nm) multi-wall CNTs. The nanotubes were contacted with Ti/Pd/Au (0.5/20/20 nm) electrodes defined using photolithography. An image of a typical CNT device is shown in FIG. 1A of the main text. The electrode separation on our test chips is varied from L~1-5 µm, although the exact CNT length is not essential for low-power GST switching, with the CNTs being much more conductive than the GST bit (~100 kΩ vs. 1 MΩ-1 GΩ; also see main text FIG. 3)[12].

2. PMMA Coating, GST Deposition and Lift-Off

PMMA Coating: After fabricating the CNT device, we spin a thin layer of poly(methyl methacrylate) (PMMA). The thin film thickness can be controlled by varying the spin rate and/or adding A-thinner into the PMMA 495 A2 solution. A-thinner PMMA layer generates narrower nanotrench upon Joule heating; while a thicker PMMA layer gives better lift-off results. The PMMA thickness was measured by ellipsometry and confirmed by AFM measurement. Table S1 shows the PMMA thickness under different conditions. Typical PMMA thickness used in this study is ~50 nm. The device is then baked at 200° C. for 90 seconds after spin coating.

GST Deposition: In this work, $Ge_2Sb_2Te_5$ (GST) is deposited by dc sputtering with an AJA ATC 2000 custom four gun co-sputtering system. The GST sputtering target is of 99.999% purity, customer made from ACI Alloys Inc. Deposition power (6 W) and rate (0.1 Å/s) was kept minimal so as to minimize the damage to the PMMA thin film and to the CNT. This would ensure a smoother lift-off later on. Nevertheless, GST deposition by sputtering is found to cause some damage to semiconducting CNTs. By contrast, metallic CNTs appear to survive GST sputtering with little damage, most likely by virtue of being small-diameter multi-walled CNTs (i.e. it is possible that the outer wall protects the inner walls from sputtering damage). The GST thin film thickness is ~10 nm, confirmed by both X-ray reflectivity (XRR) and AFM measurements. FIG. 6 depicts the XRR measurement results from a Philips Xpert Pro XRD system on a control sample (GST thin film on Si wafer).

After GST deposition, we sometimes deposit a thin layer of encapsulation to prevent oxidation of GST. This capping layer also acts as a mechanical cap to suppress volume changes caused by phase change and improve device lifetime. We first tried sputtering 5 to 10 nm of $SiO_2$ or $Al_2O_3$ right after GST deposition without breaking the vacuum to obtain a clean interface between GST and the oxide cap. However, RF sputtering of either oxide would require relatively high power (>100 W), which damages the PMMA film quality and often causes lift-off issues. Moreover, depositing the capping layer before lift-off would leave the sidewalls of the GST nanowire uncovered. Thus we chose to first perform lift-off to form the self-aligned GST nanowire; then we used e-beam evaporation to deposit ~10 nm of $SiO_2$ to cover up the entire sample. The e-beam evaporation was done in a Denton e-beam optical coater. Lift-off is performed by immersing the sample in a warm acetone (50 to 60° C.) for 30 minutes. Sonicating the solution for 5 to 10 seconds improves lift-off results, though prolonged sonication is detrimental to the CNT device. In FIG. 1 (main manuscript) and FIG. 7 below, we show AFM measurements of a typical self-aligned nanotube-nanowire device at different stages.

3. Atomic Force Microscopy

The AFM imaging was performed using a MFP3D™ Asylum AFM. Most scans were done in tapping mode with a silicon tip that has a nominal radius of 7 nm. The scan size was typically kept small, less than 5 μm×5 μm with a scan rate of 1 Hz. The resolution was 512×512. The drive amplitude and set point were carefully monitored to ensure good tracking of the surface.

4. Experimental Setup for Electrical Characterization

DC measurements: All dc electrical characterizations were performed with a Keithley 4200 semiconductor characterization system (SCS). Some electrical measurements (e.g. PMMA nanotrench formation) were performed in vacuum (~$10^{-5}$ ton) in a Janis ST-100-UHV-4 probe station equipped with a heating stage. Electrical breakdown of CNTs to form the nanogap was done in a probe station in air ambient, under an Ar flow nozzle[19]. During the dc SET operation of the PCM device (amorphous to crystalline or a→c transition), we monitored the voltage across the device while sweeping the current gradually. This prevents a sudden increase in current caused by large increase in device conductance during the phase change. The voltage compliance is set at 40 V during the current sweep. Note that SET transitions were created both with dc current sweeps (as outlined above and in FIG. 2B) and pulsed voltages (as outlined below).

Pulsed measurements: We used a Keithley 3402 pulse generator to produce all the programming pulses. The SET pulse is typically 300-ns wide with 50-ns rising/falling edges; the RESET pulse is usually 50-ns in width with 2-ns edge time. Shorter pulses, down to ~30-ns width have also been used to obtain lower programming energy per bit (see main text). However, the lower bound of our pulse capability is limited by our setup and specifically by the capacitance of the large contact pads to the CNT device. In principle, PCM switching even with ~1-ns pulse widths should be achievable as suggested by previous work[31,32]. This would reduce the operating energy in this work to the regime of single femtojoules per bit.

Memory endurance test: Device endurance tests are automated via LabVIEW scripts. A typical cycle of the endurance test includes: 1) read the a-GST resistance at 0.5 V using Keithley 4200 SCS; 2) send a SET pulse for a→c phase transition using the pulse generator; 3) read the c-GST resistance at 0.5 V; 4) send a RESET pulse for c→a transition. A Hewlett-Packard 59307A VHF switchbox is used to switch the device connection between SCS and the pulse generator. FIG. 8 shows the connections of a typical endurance test.

5. More Data Analysis

Self-aligned PCM nanotube-nanowire devices: A total of 102 self-aligned CNT-NW devices were tested in total. In addition to the characteristics shown in the main text, dc electrical and AFM measurements of other self-aligned PCM devices are shown in FIG. 9.

$V_T$ reduction: As mentioned in the main text, the threshold voltage $V_T$ of such PCM devices typically decreases and stabilizes after a few programming cycles. This reduction in $V_T$ is not uncommon, since the as-deposited amorphous material is different from the melt-quenched a-GST[33]. In FIG. 10A, we present a histogram of the initial $V_T$ (bottom pane) and after several cycles of "burn-in" (top pane) for 24 devices. The $V_T$ reduction ranges from 3.2% to as much as 40.3%, with an average of ~23%. In FIG. S6b, we see that the final $V_T$ is ~77% of initial $V_T$.

Resistance off/on ratio: In FIG. 11A, we plotted the histogram of $R_{off}/R_{on}$ of the 102 PCM self-align NW devices that we studied. The average $R_{off}/R_{on}$ is ~900 with the highest ratio ~2200. These values are ~10× higher than previously reported in Ref 3, due to the elimination of the a-GST leakage pathways. We also plotted the $R_{off}/R_{on}$ against their respective threshold voltages in FIG. 11B.

Device scaling analysis: We have plotted the threshold voltage $V_T$ as a function of the CNT length in FIG. 12A and found an approximate positive correlation. This is consistent with previous findings suggesting longer CNTs create larger nanogaps with our electrical breakdown method, which in turn results in higher threshold voltage[17,19]. Longer CNTs also introduce slightly larger parasitic series resistance to the nanoscale PCM bit. FIG. 12B plots the RESET current as a function of the GST nanowire width. There is no obvious trend in the plot. Coupled with findings shown in FIG. 3B in the main text, this suggests that the active bit phase change region is primarily determined by the CNT electrode size, and less so by the NW width[1o].

RESET current scaling: To see how this work compares to state-of-the-art PCM devices, in FIG. 13A, we plot the RESET current against the CNT electrode contact area for our self-aligned devices as well as other PCM devices reported in the literature[7,34]. We can see that our results fit with the general scaling trend observed, and scales approximately as $A^{0.83}$, where A is the contact area. This is expected for PCM devices that scale non-isotropically[35] (area and thickness are not scaled similarly), since the CNT diameter and the nanogap size does not correlate perfectly in our devices. The current densities of our PCM NW devices and other PCM devices are plotted in FIG. S9b. The power fit (dashed line) has a slope of −0.17, consistently with FIG. 13A.

Estimate of effective bit cross-sectional area: In FIG. 3A of the main text, we plotted the $R_{ON}$ ($R_{OFF}$) of all devices tested against their respective $V_T$. The y-intercept of the on-state is the parasitic resistance introduced by the CNT and CNT-GST and CNT-Pd contacts. We found $R_C$ ~720 kΩ. which is larger than the typical resistance of our CNTs before processing (~100 kΩ) signifying. This suggests that the fabrication introduces some defects, and that CNT-Pd and CNT-GST contact resistances could be improved, leading to potentially higher off/on ratios.

The slope of the linear fits in FIG. 3A can also be interpreted as follows. The measured resistance of the bit from pad-to-pad is:

$$R_{ON,OFF} = R_C + \rho_{c,a} \frac{l}{A} \quad (1)$$

where $\rho_{c,a}$ is the resistivity of the GST bit (crystalline or amorphous), $R_C$ is a state-dependent contact-resistance and l and A are the length of the PCM bit (the nanogap size) and its effective cross-section, respectively. We note that this effective cross-section is not necessarily the NW cross-section, nor the CNT cross-section, but most likely lies between the two. We can also express the measured threshold voltage as:

$$V_T = Fl + IR_C \qquad (2)$$

where F~50-100 V/μm is the threshold field for switching in the nanogap[10] and $IR_C$ is the total parasitic voltage drop at the threshold point. Hence we can obtain a simple expression linking the measured $R_{ON,OFF}$ and $V_T$ through a linear trend:

$$R_{ON,OFF} = R_C + \left(\frac{\rho_{c,a}}{A}\right)\left(\frac{V_T - IR_C}{F}\right) \qquad (3)$$

Thus the slope of the linear fit of R vs. $V_T$ is $dR/dV_T$~$\rho/(AF)$, which allows us to estimate an effective cross-sectional area of the bit in both its on and off states. Taking the resistivity of GST in the two states as $\rho_a$~1 Ω·m and $\rho_c$~$10^{-4}$ Ω·m, respectively, F as given above, and slopes of 0.5 (on-state) and 110 MΩ/V (off-state) as found in the main text (FIG. 3A), we can obtain estimates of the bit area $A_{on}$~2-4 nm² for the on-state and $A_{off}$~90-180 nm² for the off-state. The average on-state bit area is very close to the typical CNT cross-sectional area, potentially suggesting conduction through a single GST filament bridging the two CNT electrode tips in the nanogap. A similar filamentary-switching was recently proposed for CNT-contacted PCM device [Liang. VLSI 2011]. The average off-state bit area is slightly smaller than the cross-section of the NWs. This is because the current in the off-state is no more confined within the crystallized filament.

Resistance drift: FIG. 14 depicts drift behavior of two more self-aligned PCM nanotube-nanowire devices after RESET, with and without oxide capping layers. We observe the same trend as reported in the main text (FIG. 2F) and by others[24,26]. The resistance drift in the PCM nanowires is extremely low when uncapped. The drift coefficient for capped devices is slightly higher, but in line with previous measurements [9, 11, 12].

Activation energy: We also measured the activation energy of a-GST in our device by measuring the subthreshold I-V characteristics at different temperatures (FIG. 15A). In FIG. 15B, we can see that the activation energy of a-GST decreases as the applied bias increases, consistent with the Poole-Frenkel transport mechanism expected for amorphous chalcogenides[36].

6. Nanotrench Formation

Power dependence: The self-aligned nanofabrication process is not only a good approach to examine the fundamental scaling of PCM devices, but it also has the potential to be used as a platform for many other relevant applications. For instance, the nanotrench could be used to precisely position and measure other types of nanowires, nanoparticles, or even single molecules (such as DNA strands) between the two CNT electrodes.

In order to extend the utility of this method, it is important to understand and control the nanotrench formation process. The nanotrench width depends on many parameters such as input power, bias duration, ambient temperature, PMMA thickness etc. FIG. 4 in the main text already illustrates how the trench width varies with input power. In FIG. 16 below, we present additional AFM images of nanotrench formation under various power input conditions.

Time dependence: We studied how the width of the nanotrench of a typical CNT device (FIG. 17A) coated with ~50-nm of PMMA changed as a function of the applied bias time, with everything else remained constant. FIGS. 17B-D show the AFM images of the nanotrench of this device under 25 V dc bias for 1 s, 5 s and 10 s, respectively. The nanotrench width increases from 61 nm to 80 nm between 1 and 5 s, with no further increase beyond 5 s. This time scale is much longer than the thermal time constant of the system (a few hundreds of nanoseconds), suggesting that viscous flow plays a role in the trench formation process.

Analytical Thermal Model: We employed an analytical model to estimate the nanotrench width as a function of the input power per CNT channel length. The temperature in the PMMA thin film can be modeled to have a Gaussian shape given by $T(x)=T_m \exp(-x^2/2\lambda^2)$, where $T_m$ is the maximum temperature of PMMA on top of the CNT heater,) is a thermal diffusion length from the CNT in the normal direction. Assume nanotrench width is W and at the nanotrench edge, the temperature $T=T_b$, where $T_b$ is the boiling point of PMMA. Simple geometry calculation suggests that $x^2=(W/2)^2+t_d^2$, where $t_d$ is the PMMA thickness. From this, we can see that the nanotrench width W should scale logarithmically with the input power per length such that: $W=2\sqrt{2\lambda^2\ln(T_m/T_b)-t_d^2}$. With $t_d$=50 nm, $T_b$=260° C. and λ=55 nm, we plotted the trench width predicted by this thermal model in FIG. 18. It agrees well with experimental data as well as finite element simulation results.

7. Finite Element Modeling

Simulation model: We developed a finite element model using COMSOL Multiphysics to numerically evaluate the temperature profile in PMMA during nanotrench formation. This also serves as the simulation platform that could guide us in optimizing the nanotrench formation process in the future. The schematics of this 3-dimensional model are shown in FIG. 19. In order to save simulation resources and time, we assumed that the device is perfectly symmetric and only simulated one quadrant. The planes of symmetry are along the CNT axial axis and the plane perpendicular to the CNT. The CNT diameter is 2 nm with a total length of 2 μm, on top of 90-nm thick $SiO_2$ (area=50 μm×5 μm). The bottom Si layer is 100 μm thick. The PMMA thin film is on top of the oxide layer and is typically 50 nm thick, unless otherwise specified.

The thermal conductivities of CNT, $SiO_2$, Si and PMMA are 3300, 1.4, 150 and 0.2 W/(m·K), respectively[37]. Thermal boundary resistances[38] are simulated at all interfaces and have typical values ranging from 0.5-1×10⁸ W/(m²·K). Convection cooling and radiation loss are ignored in this model. Thus, most external boundary conditions are set as adiabatic, except at the bottom and sidewall, where the temperature is set as the constant ambient temperature.

Simulation results: The PMMA boiling point is assumed to be $T_b$~260° C. The nanotrench width is calculated by plotting the temperature contour in PMMA, as depicted in FIG. 19B. We varied parameters such as input power, bias duration and ambient temperature. FIG. 17B summarizes the simulation results at different temperatures (200, 250, 300, 350 and 400 K) and different input power. These results confirm an approximately logarithmic scaling trend as predicted by our simpler thermal model. It is promising to note that we could create sub-20 nm trenches at low ambient temperatures. These will be investigated in more details in future studies.

8. Applications to Metal Nanowire and Resistive Random Access Memory (RRAM)

Metal nanotube-nanowire devices: Other than PCM device scaling, other applications of this self-aligned fabrication technique are also being explored experimentally. FIG. 20 shows results for self-aligned Au NWs deposited into the nanotrench. Due to the metal cooling effect, there exists a thermal healing length in CNT near the contacts where the temperature is low[39]. This is evident in AFM images, where there was no Au metal deposited. Thus, by creating the nanotrench in PMMA via local Joule heating and then evaporating Au into the trench, we could fabricate a much shorter CNT device with length in the hundreds and even tens of nanometer regime in correspondence of the healing length at the two Pd contacts. From the I-V curves in FIG. 20 of the devices after Au nanowire deposition, we can see that the semiconducting and metallic CNTs still retain their original chirality. This could serve as a valuable approach to study 1-dimensional transport of CNTs in the ballistic regime.

RRAM nanotube-nanowire devices: $TiO_x$ and $HfO_x$ are promising materials as switching elements for future resistive random access memory (RRAM)[40,41]. We used our self-aligned process to fabricate RRAM nanotube-nanowire devices. In FIG. 20, we show AFM images of self-aligned $TiO_x$ and $HfO_x$ nanowires with CNT electrodes. Both oxides were 10 nm thick and e-beam evaporated. A non-ohmic I-V characteristic, with a decrease of resistance at high voltage, is observed in both cases (FIG. 21). The small hysteresis in the I-V curve of $TiO_x$ under positive bias reveals a resistive-switching effect, while no hysteretic behaviors where seen in $HfO_x$. This might be due to the CNT nanogaps (typically ~50 nm) being too large for RRAM applications, as well as metal oxide unoptimized composition.

ADDITIONAL REFERENCE

1. Khajetoorians, A. A., Wiebe, J., Chilian, B. & Wiesendanger, R. Realizing All-Spin-Based Logic Operations Atom by Atom. *Science* 332, 1062-1064 (2011).
2. McCamey, D. R., Van Tol, J., Morley, G. W. & Boehme, C. Electronic Spin Storage in an Electrically Readable Nuclear Spin Memory with a Lifetime>100 Seconds. *Science* 330, 1652-1656 (2010).
3. Borghetti, J. et al. 'Memristive' switches enable 'stateful' logic operations via material implication. *Nature* 464, 873-876 (2010).
4. Waser, R. & Aono, M. Nanoionics-based resistive switching memories. *Nature Materials* 6, 833-840 (2007).
5. Wuttig, M. & Yamada, N. Phase-change materials for rewriteable data storage. *Nature Materials* 6, 824-832 (2007).
6. Bun, G. W. et al. Phase change memory technology. *Journal of Vacuum Science & Technology B* 28, 223-262 (2010).
7. Wong, H. S. P. et al. Phase Change Memory. *Proc. IEEE* 98, 2201-2227 (2010).
8. Lee, S.-H., Jung, Y. & Agarwal, R. Highly scalable non-volatile and ultra-low-power phase-change nanowire memory. *Nature Nanotechnology* 2, 626-630 (2007).
9. Yu, D., Brittman, S., Lee, J. S., Falk, A. L. & Park, H Minimum Voltage for Threshold Switching in Nanoscale Phase-Change Memory. *Nano Letters* 8, 3429-3433 (2008).
10. Xiong, F., Liao, A. D., Estrada, D. & Pop, E. Low-Power Switching of Phase-Change Materials with Carbon Nanotube Electrodes. *Science* 332, 568-570 (2011).
11. Liang, J., Jeyasingh, R. G. D., Chen, H.-Y. & Wong, H.-S. P. A 1.4 μA Reset Current Phase Change Memory Cell with Integrated Carbon Nanotube Electrodes for Cross-Point Memory Application. *IEEE Symp. VLSI Tech. Dig.*, 100-101 (2011).
12. Xiong, F., Liao, A. & Pop, E. Inducing chalcogenide phase change with ultra-narrow carbon nanotube heaters. *Applied Physics Letters* 95, 243103 (2009).
13. Meister, S., Schoen, D. T., Topinka, M. A., Minor, A. M. & Cui, Y. Void Formation Induced Electrical Switching in Phase-Change Nanowires. *Nano Letters* 8, 4562-4567 (2008).
14. Pop, E. Energy Dissipation and Transport in Nanoscale Devices. *Nano Research* 3, 147-169 (2010).
15. Chua, E. K. et al. Low resistance, high dynamic range reconfigurable phase change switch for radio frequency applications. *Applied Physics Letters* 97, 183506 (2010).
16. Kang, M. J. et al. PRAM Cell Technology and Characterization in 20 nm Node Size. *IEEE IEDM Tech. Dig.*, 39-42 (2011).
17. Liao, A. D. et al. Thermal dissipation and variability in electrical breakdown of carbon nanotube devices. *Physical Review B* 82, 205406 (2010).
18. Jin, C. Y., Li, Z. Y., Williams, R. S., Lee, K. C. & Park, I. Localized Temperature and Chemical Reaction Control in Nanoscale Space by Nanowire Array. *Nano Letters* 11, 4818-4825 (2011).
19. Qi, P. et al Miniature Organic Transistors with Carbon Nanotubes as Quasi-One-Dimensional Electrodes. *J. Am. Chem. Soc.* 126, 11774 (2004).
20. Thiele, C. et al. Controlled fabrication of single-walled carbon nanotube electrodes by electron-beam-induced oxidation. *Applied Physics Letters* 99, 173105 (2011).
21. Ielmini, D. Threshold switching mechanism by high-field energy gain in the hopping transport of chalcogenide glasses. *Physical Review B* 78, 035308 (2008).
22. Bichet, 0., Wright, C. D., Samson, Y. & Gidon, S. Local characterization and transformation of phase-change media by scanning thermal probes. *Journal of Applied Physics* 95, 2360-2364 (2004).
23. Servalli, G. A 45 nm Generation Phase Change Memory Technology. *IEEE IEDM Tech. Dig.*, 113-116 (2009).
24. Mitra, M., Jung, Y., Gianola, D. S. & Agarwal, R. Extremely low drift of resistance and threshold voltage in amorphous phase change nanowire devices. *Applied Physics Letters* 96, 222111 (2010).
25. Li, J. et al. Explore Physical Origins of Resistance Drift in Phase Change Memory and its Implication for Drift-Insensitive Materials. *IEEE IEDM Tech. Dig.*, 291-294 (2011).
26. Ielmini, D., Sharma, D., Lavizzari, S. & Lacaita, A. L. Reliability Impact of Chalcogenide-Structure Relaxation in Phase-Change Memory (PCM) Cells-Part I: Experimental Study. *IEEE Transactions on Electron Devices* 56, 1070-1077 (2009).
27. Lin, Y. C., Bai, J. W. & Huang, Y. Self-Aligned Nanolithography in a Nanogap. *Nano Letters* 9, 2234-2238 (2009).
28. Guo, X. et al. Covalently Bridging Gaps in Single-Walled Carbon Nanotubes with Conducting Molecules. *Science* 311, 356-359 (2006).
29. Venkatesan, B. M. et al. Stacked Graphene-$Al_2O_3$ Nanopore Sensors for Sensitive Detection of DNA and DNA-Protein Complexes. *ACS Nano* 6, 441-450 (2011).
30. Liao, A., Zhao, Y. & Pop, E. Avalanche-Induced Current Enhancement in Semiconducting Carbon Nanotubes. *Physical Review Letters* 101, 256804 (2008).
31. Bruns, G. et al. Nanosecond switching in GeTe phase change memory cells. *Applied Physics Letters* 95, 043108-043103 (2009).
32. Wang, W. J. et al. Fast phase transitions induced by picosecond electrical pulses on phase change memory cells. *Appl. Phys. Lett.* 93, 043121 (2008).
33. Raoux, S. et al. Phase-change random access memory: A scalable technology. *IBM J. Res. & Dev.* 52, 465-479 (2008).

34. Pirovano, A. et al. Scaling analysis of phase-change memory technology. *IEDM Tech. Dig.*, 699-702 (2003).
35. Russo, U., Ielmini, D., Redaelli, A. & Lacaita, A. L. Modeling of programming and read performance in phase-change memories—Part I: Cell optimization and scaling. *Ieee T Electron Dev* 55, 506-514 (2008).
36. Ielmini, D. & Zhang, Y. G. Analytical model for subthreshold conduction and threshold switching in chalcogenide-based memory devices. *Journal of Applied Physics* 102, 054517 (2007).
37. Chen, I. R. & Pop, E. Compact Thermal Model for Vertical Nanowire Phase-Change Memory Cells. *IEEE Transactions on Electron Devices* 56, 1523-1528 (2009).
38. Pop, E. The role of electrical and thermal contact resistance for Joule breakdown of single-wall carbon nanotubes. *Nanotechnology* 19, 295202 (2008).
39. Pop, E., Mann, D. A., Goodson, K. E. & Dai, H. J. Electrical and thermal transport in metallic single-wall carbon nanotubes on insulating substrates. *Journal of Applied Physics* 101, -(2007).
40. Chen, Y. S. et al. Highly Scalable Hafnium Oxide Memory with Improvements of Resistive Distribution and Read Disturb Immunity. IEDM Tech. Dig., 105-108 (2009).
41. Yang, J. J. et al. Memristive switching mechanism for metal/oxide/metal nanodevices. *Nature Nanotechnology* 3, 429-433 (2008).

From the foregoing descriptions, it would be evident to an artisan with ordinary skill in the art that the aforementioned embodiments can be modified, reduced, or enhanced without departing from the scope and spirit of the claims described below. For example, a nanowire as described in the subject disclosure may be used to interconnect circuits of various types such as, for example, transistors, memory cells, sensors, single molecules for molecular electronics, nanoparticles, DNA strands and so on. A nanowire can be represented by geometries other than a straight line (e.g., a nanowire with curves) by forming the nanoelectrode with such geometries. Materials that can generate heat at a nano scale (nanoheaters) sufficient to form trenches can be used to form nanowires as described in the foregoing embodiments.

Other suitable embodiments are contemplated by the subject disclosure.

FIG. 22 depicts an exemplary diagrammatic representation of a machine in the form of a computer system 1800 which can be constructed in whole or in part with nanowires as described in the subject disclosure. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a smart phone, a laptop computer, a desktop computer, a control system, a network router, switch or bridge, or any machine capable of executing a set of instructions (sequential or otherwise) that specify actions to be taken by that machine. It will be understood that a communication device of the subject disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methods discussed herein.

The computer system 1800 may include a processor 1802 (e.g., a central processing unit (CPU), a graphics processing unit (GPU, or both), a main memory 1804 and a static memory 1806, which communicate with each other via a bus 1808. The computer system 1800 may further include a video display unit 1810 (e.g., a liquid crystal display (LCD), a flat panel, or a solid state display. The computer system 1800 may include an input device 1812 (e.g., a keyboard), a cursor control device 1814 (e.g., a mouse), a disk drive unit 1816, a signal generation device 1818 (e.g., a speaker or remote control) and a network interface device 1820.

The disk drive unit 1816 may include a tangible computer-readable storage medium 1822 on which is stored one or more sets of instructions (e.g., software 1824) embodying any one or more of the methods or functions described herein, including those methods illustrated above. The instructions 1824 may also reside, completely or at least partially, within the main memory 1804, the static memory 1806, and/or within the processor 1802 during execution thereof by the computer system 1800. The main memory 1804 and the processor 1802 also may constitute tangible computer-readable storage media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the subject disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

While the tangible computer-readable storage medium 622 is shown in an example embodiment to be a single medium, the term "tangible computer-readable storage medium" should be taken to include a single medium or multiple media (e.g., a centralized or distributed database, and/or associated caches and servers) that store the one or more sets of instructions. The term "tangible computer-readable storage medium" shall also be taken to include any non-transitory medium that is capable of storing or encoding a set of instructions for execution by the machine and that cause the machine to perform any one or more of the methods of the subject disclosure.

The term "tangible computer-readable storage medium" shall accordingly be taken to include, but not be limited to: solid-state memories such as a memory card or other package that houses one or more read-only (non-volatile) memories, random access memories, or other re-writable (volatile) memories, a magneto-optical or optical medium such as a disk or tape, or other tangible media which can be used to store information. Accordingly, the disclosure is considered to include any one or more of a tangible computer-readable storage medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are from time-to-time superseded by faster or more efficient equivalents having essentially the same functions. Wireless standards for device detection (e.g., RFID), short-range communications (e.g., Bluetooth, WiFi, Zigbee), and long-range communications (e.g., WiMAX, GSM, CDMA) are contemplated for use by computer system 1800.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A device, comprising:
   a first circuit component;
   a second circuit component; and
   a nanowire coupled to a first teiminal of the first circuit component, and a second terminal of the second circuit component,
   wherein the nanowire forms a conductive channel between the first circuit component and the second circuit component,
   wherein the nanowire comprises a phase change material deposited in a trench aligned with a nanoelectrode, wherein the phase change material covers the nanoelectrode, and wherein an outer surface of the phase change material conforms to an outer surface of the nanoelectrode, and
   wherein the nanoelectrode has a nanogap formed therethrough without being formed in the phase change material.

2. The device of claim 1, wherein the nanoelectrode is one of a nanotube or a graphene ribbon, and wherein the phase change material is a conductive material.

3. The device of claim 1, wherein the first circuit component is a first transistor, and wherein the second circuit component is a second transistor.

4. The device of claim 3, wherein the first terminal of the first circuit component is one of a drain teiniinal, a source terminal, or a gate terminal of the first transistor.

5. The device of claim 3, wherein the second terminal of the second circuit component is one of a drain terminal, a source terminal, or a gate terminal of the second transistor.

6. The device of claim 1, wherein the phase change material fills the nanogap.

7. The device of claim 1, wherein the nanoelectrode is a single-wall carbon nanotube.

8. The device of claim 1, wherein the nanoelectrode is a multi-wall carbon nanotube.

9. The device of claim 1, wherein the phase change material comprises a chalcogenide material.

10. The device of claim 1, further comprising a silicon substrate, wherein an entire length of the nanowire is formed on the silicon substrate.

11. A device, comprising:
    a substrate;
    nanowire formed on the substrate; and
    first and second electrodes formed on the substrate,
    wherein the nanowire is connected between the first and second electrodes, wherein the nanowire comprises a nanoelectrode covered by a phase change material, wherein the nanoelectrode is a carbon nanotube, wherein an outer surface of the phase change material conforms to an outer surface of the nanoelectrode, wherein the carbon nanotube has a nanogap formed therethrough without being formed in the phase change material, and wherein the phase change material fills the nanogap.

12. A device, comprising:
    a substrate;
    a first circuit component;
    a second circuit component; and
    a nanowire formed on the substrate, wherein the nanowire is coupled to a first terminal of the first circuit component, and a second terminal of the second circuit component,
    wherein the nanowire forms a conductive channel between the first circuit component and the second circuit component,
    wherein the nanowire comprises a material deposited in a trench aligned with a nanoelectrode,
    wherein the material covers the nanoelectrode,
    wherein an outer surface of the material conforms to an outer surface of the nanoelectrode,
    wherein the nanoelectrode has a nanogap formed therethrough without being formed in the material, and
    wherein the material fills the nanogap.

13. The device of claim 12, wherein the material is a phase change material.

14. The device of claim 12, wherein an entire length of the nanowire is formed on the substrate.

15. The device of claim 1, wherein the outer surface of the phase change material is cylindrical.

* * * * *